(12) United States Patent
Yamamoto

(10) Patent No.: US 11,314,136 B2
(45) Date of Patent: Apr. 26, 2022

(54) ACTIVE MATRIX SUBSTRATE AND DISPLAY DEVICE

(71) Applicant: Sharp Kabushiki Kaisha, Sakai (JP)

(72) Inventor: Kaoru Yamamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 64 days.

(21) Appl. No.: 16/904,622

(22) Filed: Jun. 18, 2020

(65) Prior Publication Data

US 2020/0409193 A1 Dec. 31, 2020

Related U.S. Application Data

(60) Provisional application No. 62/867,929, filed on Jun. 28, 2019.

(51) Int. Cl.
  *G02F 1/1368* (2006.01)
  *H01L 27/12* (2006.01)
  *G09G 3/36* (2006.01)

(52) U.S. Cl.
  CPC ......... *G02F 1/1368* (2013.01); *G09G 3/3648* (2013.01); *H01L 27/1225* (2013.01); *H01L 27/1251* (2013.01); *G09G 2310/0297* (2013.01)

(58) Field of Classification Search
  CPC .............. G02F 1/1368; G09G 3/3648; G09G 2310/0297; H01L 27/1225; H01L 27/1251
  USPC .................................................. 349/149–152
  See application file for complete search history.

(56) References Cited

U.S. PATENT DOCUMENTS

| | | | |
|---|---|---|---|
| 2012/0138922 A1 | 6/2012 | Yamazaki et al. | |
| 2013/0038518 A1 | 2/2013 | Tagawa et al. | |
| 2013/0320334 A1 | 12/2013 | Yamazaki et al. | |
| 2014/0286076 A1 | 9/2014 | Aoki et al. | |
| 2016/0210904 A1* | 7/2016 | Na | G09G 3/3291 |
| 2016/0293093 A1* | 10/2016 | Seo | G09G 3/20 |
| 2016/0329025 A1* | 11/2016 | Park | G09G 3/3648 |

FOREIGN PATENT DOCUMENTS

| | | |
|---|---|---|
| JP | 2012-134475 A | 7/2012 |
| JP | 2014-007399 A | 1/2014 |
| JP | 2014-209727 A | 11/2014 |
| WO | 2011/118079 A1 | 9/2011 |
| WO | 2018/190245 A1 | 10/2018 |

\* cited by examiner

*Primary Examiner* — Charles S Chang
(74) *Attorney, Agent, or Firm* — Keating & Bennett, LLP

(57) ABSTRACT

An active matrix substrate is provided with a demultiplexer circuit. Each unit circuit of the demultiplexer circuit splits the display signal from a single signal output line to n source bus lines. Each unit circuit includes n branch lines and n switching TFTs. The demultiplexer circuit includes boost circuits configured to boost the voltage applied to the gate electrodes of the switching TFTs. Each boost circuit includes a set section that pre-charges a node connected to the gate electrode, a boost section that boosts the potential of the node pre-charged by the set section, and a reset section that resets the potential of the node. The demultiplexer circuit includes an equalizer circuit configured to perform charge sharing by electrically connecting a first node boosted by the boost section of a first boost circuit and a second node boosted by the boost section of a second boost circuit.

18 Claims, 20 Drawing Sheets

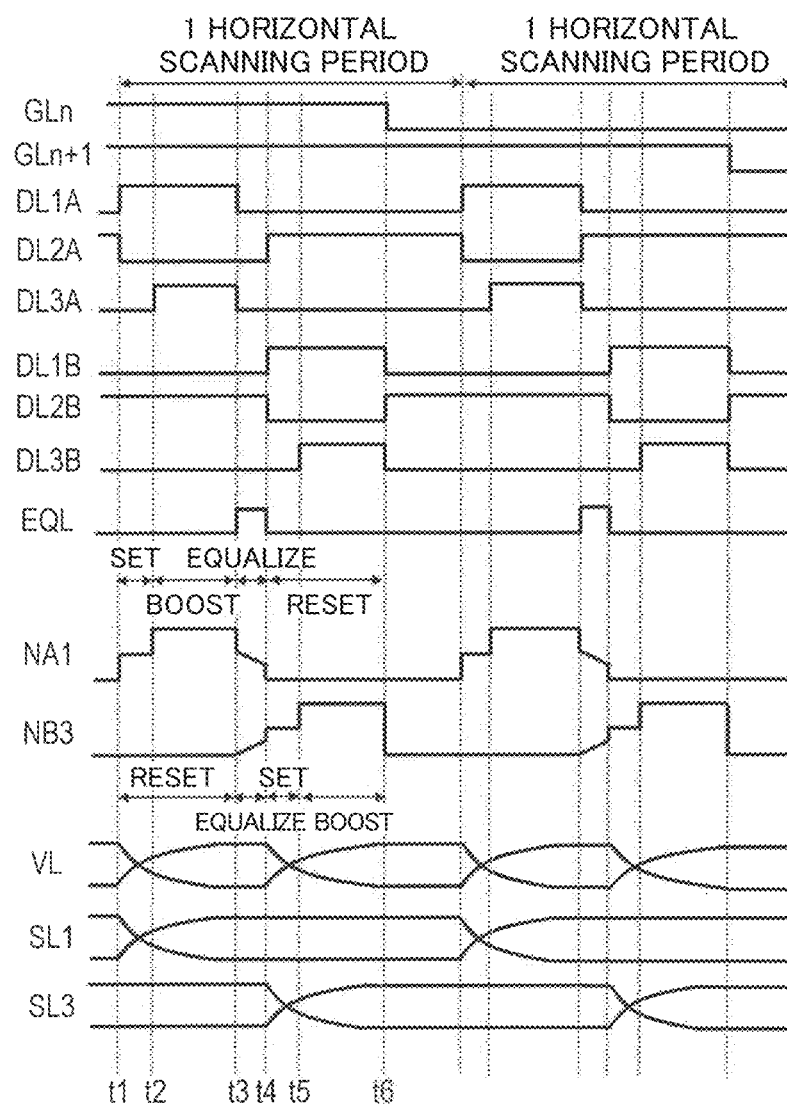

ACTIVE MATRIX SUBSTRATE AND DISPLAY DEVICE

CROSS-REFERENCE TO RELATED APPLICATION

The present application claims priority from Provisional Application No. 62/867,929, the content to which is hereby incorporated by reference into this application.

BACKGROUND OF THE INVENTION

1. Field of the Invention

The present invention relates to an active matrix substrate, and more particularly to an active matrix substrate provided with a demultiplexer circuit. In addition, the present invention also relates to a display device provided with such an active matrix substrate.

2. Description of the Related Art

An active matrix substrate used in a display device or the like includes a display region having a plurality of pixels and a region other than the display region (a non-display region or bezel region). In the display region, a switching element such as a thin-film transistor (TFT) is provided for every pixel. In the past, a TFT using amorphous silicon film as an active layer (hereinafter referred to as an amorphous silicon TFT) and a TFT using a polycrystalline silicon film as an active layer (hereinafter referred to as a polycrystalline silicon TFT) have been widely used as such a switching element.

The use of an oxide semiconductor instead of amorphous silicon or polycrystalline silicon as the active layer material of a TFT has been proposed. Such a TFT is called an "oxide semiconductor TFT". An oxide semiconductor has higher mobility than amorphous silicon. For this reason, an oxide semiconductor TFT is capable of operating at faster speeds than an amorphous silicon TFT.

In some cases, a peripheral circuit such as a driving circuit is formed monolithically in the non-display region of the active matrix substrate. By forming the driving circuit monolithically, a narrower non-display region (thinner bezel) and cost reductions due to a simplified mounting process are achieved. For example, in the non-display region, a gate driver circuit is formed monolithically while a source driver circuit is mounted using a chip-on-glass (COG) method in some cases.

In devices with a strong demand for thinner bezels, such as smartphones, there have been proposals to monolithically form a demultiplexer (DEMUX) circuit such as a source shared driving (SSD) circuit in addition to the gate driver (for example, see International Publication No. 2011/118079 and Japanese Unexamined Patent Application). The SSD circuit is a circuit that divides a video signal from a single video signal line connected to each terminal of the source driver into a plurality of source lines. By providing the SSD circuit, the region where the terminal portion and lines are disposed (terminal section and line formation region) in the non-display region can be made narrower. Additionally, because the number of outputs from the source driver decreases and the circuit scale can be decreased, the cost of the driver IC can be reduced.

Peripheral circuits such as the driving circuit and the SSD circuit include TFTs. In this specification, a TFT disposed as a switching element in each pixel of the display region is called a "pixel TFT", while a TFT forming a peripheral circuit is called a "circuit TFT". Also, among the circuit TFTs, a TFT used as a switching element in the DEMUX circuit (SSD) circuit is called a "DEMUX circuit TFT".

SUMMARY OF THE INVENTION

In an active matrix substrate using an oxide semiconductor TFT as the pixel TFT, from the perspective of the manufacturing process, it may be preferable for the DEMUX circuit TFT to also be an oxide semiconductor TFT using the same oxide semiconductor film as the pixel TFT.

However, it is difficult to form the DEMUX circuit using an oxide semiconductor TFT, and in the past, a polycrystalline silicon TFT has been used as the DEMUX circuit TFT. The reason for this is as follows.

Because the mobility of an oxide semiconductor is approximately an order of magnitude smaller than polycrystalline silicon, an oxide semiconductor TFT has a smaller current driving force than a polycrystalline silicon TFT. For this reason, in the case of using an oxide semiconductor to form the DEMUX circuit TFT, it is necessary to increase the size of the TFT (increase the channel width) or raise the driving voltage compared to the case of using polycrystalline silicon. If the size of the TFT is increased, the gate capacitance load increases, and the driving power of the DEMUX circuit increases. On the other hand, raising the driving voltage of the TFT also increases the driving power of the DEMUX circuit.

Note that, as described later, even in the case of using a polycrystalline silicon TFT as the DEMUX circuit TFT, a similar problem may occur if only PMOS processes are adopted (that is, if the polycrystalline silicon TFT contains PMOS transistors only).

Accordingly, the inventor has proposed technology for reducing the driving power of the DEMUX circuit in International Publication No. 2018/190245. In the display device disclosed in International Publication No. 2018/190245, the DEMUX circuit includes boost circuits configured to boost the voltages applied to the gate electrodes of the switching TFTs, thereby achieving a reduction in the driving power. However, the inventor has pursued a variety of further studies to reduce the driving power of the DEMUX circuit further.

An embodiment of the present invention has been devised in light of the above problem, and an object thereof is to reduce the driving power of an active matrix substrate provided with a demultiplexer circuit.

Solution to Problem

This specification discloses an active matrix substrate and a display device as described in the following items.

[Item 1]

An active matrix substrate having a display region that includes a plurality of pixel regions and a peripheral region positioned at a periphery of the display region, the active matrix substrate comprising:

a substrate;

a source driver that includes a plurality of gate bus lines and a plurality of source bus lines provided on the substrate, and a source driver that is disposed in the peripheral region and includes a plurality of output terminals;

a plurality of signal output lines respectively connected to each of the plurality of output terminals of the source driver; and a demultiplexer circuit that includes a plurality of unit circuits supported by the substrate and is disposed in the peripheral region, wherein each of the plurality of unit circuits of the demultiplexer circuit splits a display signal from one signal output line among the plurality of signal output lines to n (where n is an integer equal to or greater than 2) source bus lines among the plurality of source bus lines, each of the plurality of unit circuits includes n branch lines connected to the one signal output line and n switching TFTs respectively to each of the n branch lines, being n switching TFTs that individually control a switching on/off of an electrical connection between the n branch lines and the n source bus lines, the demultiplexer circuit additionally includes a plurality of boost circuits configured to boost a voltage applied to a gate electrode of the n switching TFTs, each of the plurality of boost circuits includes a set section that pre-charges a node connected to the gate electrode, boost section that boosts a potential of the node precharged by the set section, and a reset section that resets the potential of the node, and provided that the node boosted by the boost section of a first boost circuit among the plurality of boost circuits is called a first node and the node boosted by the boost section of a second boost circuit different from the first boost circuit is called a second node, the demultiplexer circuit additionally includes an equalizer circuit configured to perform charge-sharing between the first node and the second node by electrically connecting the first node and the second node.

[Item 2]

The active matrix substrate according to Item 1, wherein the demultiplexer circuit additionally includes an equalizer signal line that supplies an equalizer signal to the equalizer circuit, and the equalizer circuit includes an equalizer TFT that includes a gate electrode connected to the equalizer signal line, and a source electrode and a drain electrode of which one is connected to the first node and the other is connected to the second node.

[Item 3]

The active matrix substrate according to Item 1 or 2, wherein the n switching TFTs included in each of the plurality of unit circuits include two switching TFTs that are switched on at mutually different timings inside one horizontal scanning period, the first boost circuit is connected to one of the two switching TFTs, and the second boost circuit is connected to the other of the two switching TFTs.

[Item 4]

The active matrix substrate according to Item 3, wherein the demultiplexer circuit includes a first driving signal line that supplies a first driving signal to the set section, a second driving signal line that supplies a second driving signal to the reset section, and a third driving signal line that supplies a third driving signal to the boost section, and the first driving signal line for the first boost circuit doubles as the second driving signal line for the second boost circuit, and the first driving signal line for the second boost circuit doubles as the second driving signal line for the first boost circuit.

[Item 5]

The active matrix substrate according to any one of Items 1 to 4, wherein the n switching TFTs included in each of the plurality of unit circuits are two switching TFTs, and the plurality of boost circuits include two boost circuits respectively connected to the two switching TFTs.

[Item 6]

The active matrix substrate according to any one of Items 1 to 4, wherein the n switching TFTs included in each of the plurality of unit circuits are two switching TFTs, and the two switching TFTs are a first switching TFT and a second switching TFT that are switched on at mutually different timings inside one horizontal scanning period, and the plurality of boost circuits include a boost circuit connected in common to the first switching TFT of two unit circuits among the plurality of unit circuits and a boost circuit connected in common to the second switching TFT of the two unit circuits.

[Item 7]

The active matrix substrate according to any one of Items 1 to 4, wherein the n switching TFTs included in each of the plurality of unit circuits are two switching TFTs, and the two switching TFTs are a first switching TFT and a second switching TFT that are switched on at mutually different timings inside one horizontal scanning period, and the plurality of boost circuits include a boost circuit connected in common to the first switching TFT of three or more unit circuits among the plurality of unit circuits and a boost circuit connected in common to the second switching TFT of the three or more unit circuits.

[Item 8]

The active matrix substrate according to any one of Items 1 to 4, wherein the n switching TFTs included in each of the plurality of unit circuits are three switching TFTs, each of the plurality of unit circuits includes three boost circuits among the plurality of boost circuits, and each of the three boost circuits is connected to each of the three switching TFTs.

[Item 9]

The active matrix substrate according to any one of Items 1 to 4, wherein the n switching TFTs included in each of the plurality of unit circuits are three switching TFTs, the three switching TFTs are a first switching TFT, a second switching TFT, and a third switching TFT that are switched on at mutually different timings inside one horizontal scanning period, and the plurality of boost circuits include a boost circuit connected in common to the first switching TFT of two unit circuits among the plurality of unit circuits, a boost circuit connected in common to the second switching TFT of the two unit circuits, and a boost circuit connected in common to the third switching TFT of the two unit circuits.

[Item 10]

The active matrix substrate according to any one of Items 1 to 4, wherein the n switching TFTs included in each of the plurality of unit circuits are three switching TFTs, the three switching TFTs are a first switching TFT, a second switching TFT, and a third switching TFT that are switched on at mutually different timings inside one horizontal scanning period, and the plurality of boost circuits include a boost circuit connected in common to the first switching TFT of three or more unit circuits among the plurality of unit circuits, a boost circuit connected in common to the second switching TFT of the three or more unit circuits, and a boost circuit connected in common to the third switching TFT of the three or more unit circuits.

[Item 11]

The active matrix substrate according to any one of Items 1 to 10, wherein the demultiplexer circuit additionally includes a plurality of clear circuits that are respectively connected to the plurality of boost circuits and that initialize a corresponding boost circuit at a predetermined timing.

[Item 12]

The active matrix substrate according to any one of Items 1 to 11, wherein each of the set section and the reset section includes a plurality of TFTs connected in series to each other.

[Item 13]

The active matrix substrate according to any one of Items 1 to 12, wherein the plurality of boost circuits include two or more boost circuits driven at the same timing, and the demultiplexer circuit includes a first driving signal line group that supplies a driving signal group for driving a subset of boost circuits among the two or more boost circuits and a second driving signal line group that supplies a driving signal group for driving another subset of boost circuits among the two or more boost circuits, the second driving signal line group being different from the first driving signal line group.

[Item 14]

The active matrix substrate according to any one of Items 1 to 13, wherein each of the n switching TFTs includes an oxide semiconductor layer as an active layer.

[Item 15]

The active matrix substrate according to Item 14, wherein the oxide semiconductor layer contains an In—Ga—Zn—O semiconductor.

[Item 16]

The active matrix substrate according to Item 15, wherein the In—Ga—Zn—O semiconductor includes a crystalline portion.

[Item 17]

The active matrix substrate according to any one of Items 1 to 16, wherein each of the n switching TFTs is a PMOS transistor that includes a polycrystalline silicon semiconductor layer as an active layer.

[Item 18]

A display device comprising the active matrix substrate according to any one of Items 1 to 17.

According to an embodiment of the present invention, the driving power of an active matrix substrate provided with a demultiplexer circuit can be reduced.

BRIEF DESCRIPTION OF DRAWINGS

FIG. 4 is a timing chart for explaining operations by the DEMUX circuit 10.

DETAILED DESCRIPTION OF THE INVENTION

Hereinafter, embodiments of the present invention will be described with reference to the drawings. However, the present invention is not limited to the following embodiments.

Embodiment 1

Figure 1:
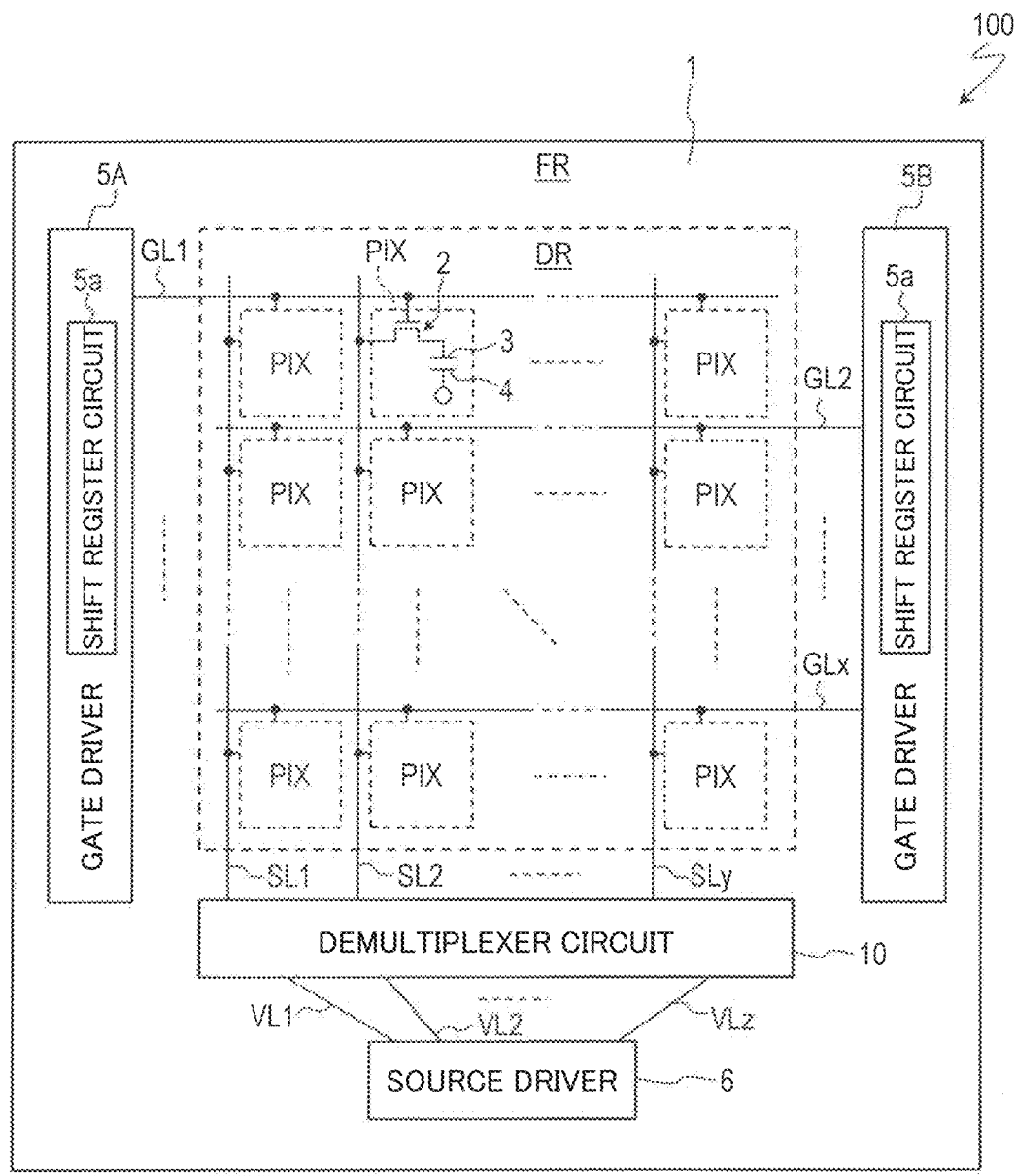
FIG. 1 is a schematic diagram illustrating one example of a plan-view structure of an active matrix substrate 100 according to Embodiment 1.

FIG. 1 is a schematic diagram illustrating one example of a plan-view structure of an active matrix substrate 100 according to the present embodiment. As illustrated in FIG. 1, the active matrix substrate 100 includes a display region DR and a peripheral region FR.

The display region DR includes a plurality of pixel regions PIX. The pixel regions PIX are regions corresponding to the pixels of the display device. Hereinafter, the pixel regions PIX will also simply be referred to as the "pixels". The plurality of pixel regions PIX are arranged in a matrix containing a plurality of rows and a plurality of columns. The display region DR is prescribed by the plurality of pixel regions PIX arranged in a matrix.

The peripheral region FR is positioned in the periphery of the display region DR. The peripheral region FR is a region that does not contribute to display, and may also be referred to as the "non-display region" or the "bezel region".

Components of the active matrix substrate 100 are supported by a substrate 1. The substrate 1 is a glass substrate, for example.

On the substrate 1, a plurality of gate bus lines (scan lines) GL and a plurality of source bus lines (signal lines) SL are provided. Each of the plurality of gate bus lines GL extends in the row direction. Each of the plurality of source bus lines SL extends in the column direction. In FIG. 1, the gate bus lines GL in a 1st row, a 2nd row, and so on to an xth row are designated "GL1", "GL2", ..., "GLx", and the source bus lines SL in a 1st column, a 2nd column, and so on to a yth column are designated "SL1", "SL2", ..., "SLy".

Typically, a region enclosed by two adjacent gate bus lines GL and two adjacent source bus lines SL is one of the pixel regions PIX. Each pixel region PIX includes a thin-film transistor 2 and a pixel electrode 3.

The thin-film transistor 2 is also called the "pixel TFT". A gate electrode and a source electrode of the thin-film transistor 2 are connected to a corresponding gate bus line GL and a corresponding source bus line SL, respectively. Also, a drain electrode of the thin-film transistor 2 is connected to the pixel electrode 3. In the case of using the active matrix substrate 100 in a liquid crystal display device with a lateral electric field mode such as fringe field switching (FFS), a shared electrode (common electrode) 4 is provided with respect to a plurality of the pixel regions PIX. In the case of applying the active matrix substrate 100 to a liquid crystal display device with a vertical electric field mode, the common electrode 4 is provided on an opposing substrate disposed opposite the active matrix substrate 100 with the liquid crystal layer in between.

In the peripheral region FR, gate drivers (scan line driving circuits) 5A and 5B that drive the gate bus lines GL, a source driver (signal line driving circuit) 6 that drives the source bus lines SL, and a demultiplexer (DEMUX) circuit 10 are disposed. The DEMUX circuit 10 functions as an SSD circuit that drives the source bus lines SL by time division. In the present embodiment, the gate drivers 5A and 5B and the DEMUX circuit 10 are formed monolithically on the substrate 1, while the source driver 6 is mounted on the substrate 1 (by COG mounting, for example).

In the illustrated example, the gate driver 5A for driving odd-numbered gate bus lines GL is disposed on the left side of the display region DR, while the gate driver 5B for driving even-numbered gate bus lines GL is disposed on the right side of the display region DR. Each of the odd-numbered gate bus lines GL is connected to each of a plurality of output terminals (not illustrated) included in the gate driver 5A. Also, each of the even-numbered gate bus lines GL is connected to each of a plurality of output terminals (not illustrated) included in the gate driver 5B. The gate drivers 5A and 5B each include a shift register 5a.

The source driver 6 is disposed below the display region DR, and the DEMUX circuit 10 is disposed between the source driver 6 and the display region DR. The source driver 6 includes a plurality of output terminals (not illustrated). A plurality of signal output lines (video signal lines) VL are provided in the region positioned between the source driver 6 and the DEMUX circuit 10. Each of the plurality of signal output lines VL is connected to each of the plurality of output terminals of the source driver 6. In FIG. 1, the 1st, 2nd, and so on to a zth signal output line VL are designated "VL1", "VL2", ..., "VLz".

Figure 2:
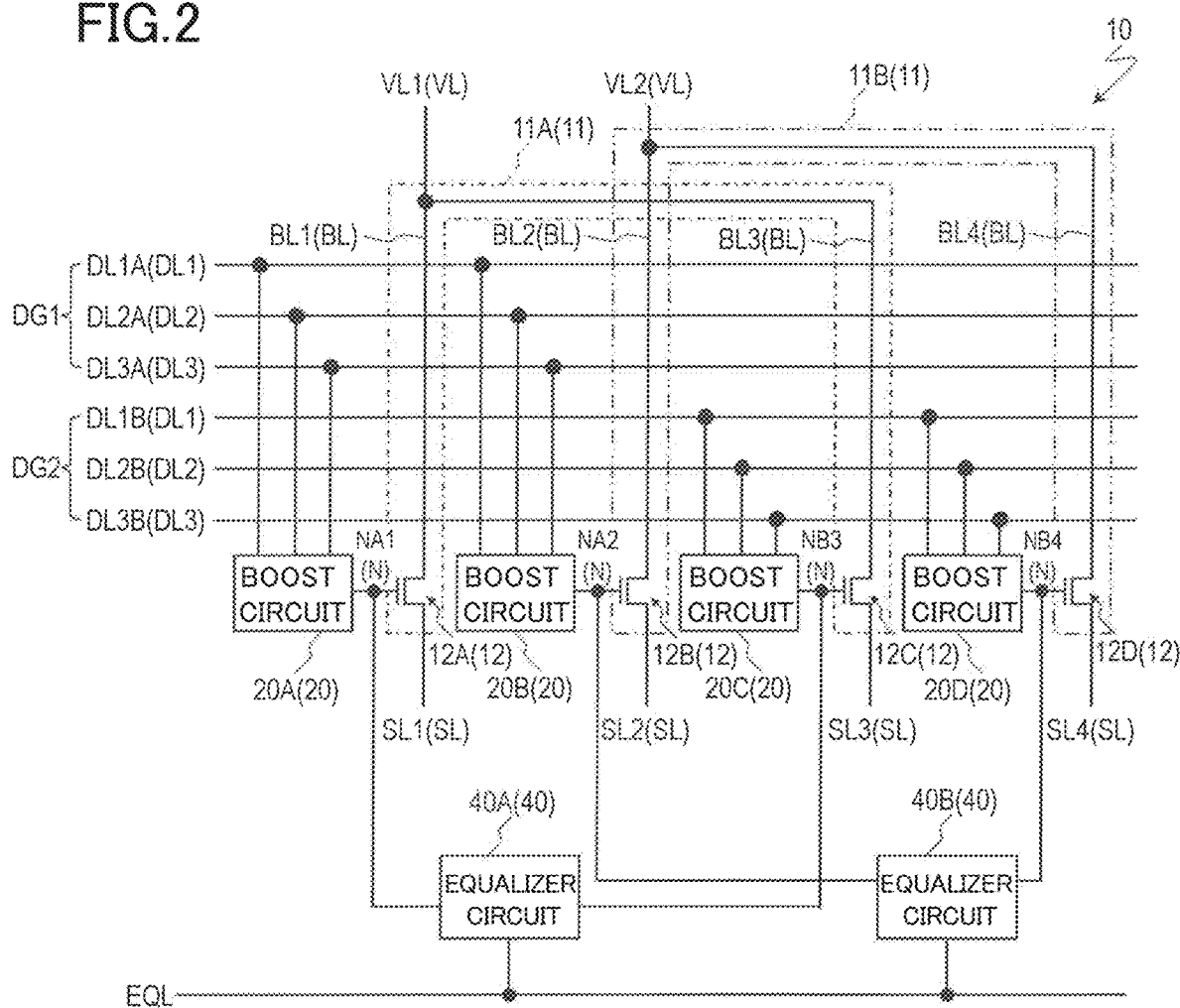
FIG. 2 is a diagram illustrating an example of a DEMUX circuit 10 provided in the active matrix substrate 100.

The DEMUX circuit 10 splits a display signal supplied from a single signal output line VL to two or more source bus lines SL. Hereinafter, the DEMUX circuit 10 will be described in further detail with reference to FIG. 2. FIG. 2 is a diagram illustrating an example of the configuration of the DEMUX circuit 10.

As illustrated in FIG. 2, the DEMUX circuit 10 includes a plurality of unit circuits 11 supported in the substrate 1. Each of the plurality of unit circuits 11 splits the display signal from a single signal output line VL to n (where n is an integer equal to or greater than 2) source bus lines SL. FIG. 2 illustrates the case where n=2, that is, the case where each unit circuit 11 splits the display signal from a single signal output line VL to two source bus lines SL. In FIG. 2, two unit circuits 11 are illustrated. Of the two unit circuits 11, one (hereinafter also referred to as the "first unit circuit") 11A splits the display signal from the signal output line VL1 to the source bus lines SL1 and SL3, while the other (hereinafter also referred to as the "second unit circuit") 11B splits the display signal from the signal output line VL2 to the source bus lines SL2 and SL4.

Each unit circuit 11 includes n (here, two) branch lines BL and n (here, two) switching TFTs 12.

The two branch lines BL of each unit circuit 11 are connected to a single signal output line VL. Also, each of the two switching TFTs 12 of each unit circuit 11 is connected to each of the two branch lines BL. The two switching TFTs 12 individually (independently) control the switching on/off of an electrical connection between the two branch lines BL and the two source bus lines SL.

In the present embodiment, each of the two switching TFTs 12 includes an oxide semiconductor layer as an active layer (that is, each is an oxide semiconductor TFT).

Of the two switching TFTs 12A and 12C of the first unit circuit 11A, one 12A controls the switching on/off of an electrical connection between the branch line BL1 and the source bus line SL1, while the other 12C controls the switching on/off of an electrical connection between the branch line BL3 and the source bus line SL3. The source electrode and the drain electrode of the former switching TFT 12A are connected to the branch line BL1 and the source bus line SL1, respectively, while the source electrode and the drain electrode of the latter switching TFT 12C are connected to the branch line BL3 and the source bus line SL3.

Of the two switching TFTs 12B and 12D of the second unit circuit 11B, one 12B controls the switching on/off of an electrical connection between the branch line BL2 and the source bus line SL2, while the other 12D controls the switching on/off of an electrical connection between the branch line BL4 and the source bus line SL4. The source electrode and the drain electrode of the former switching TFT 12B are connected to the branch line BL2 and the source bus line SL2, respectively, while the source electrode and the drain electrode of the latter switching TFT 12D are connected to the branch line BL4 and the source bus line SL4.

As illustrated in FIG. 2, the DEMUX circuit 10 in the present embodiment additionally includes a plurality of boost circuits 20 configured to boost the voltages applied to the gate electrodes of the n (here, two) switching TFTs 12 of each unit circuit 11. In the example illustrated in FIG. 2, one boost circuit 20 is connected to each switching TFT 12. Specifically, the gate electrodes of the switching TFTs 12A, 12B, 12C, and 12D are connected on the output side of boost circuits 20A, 20B, 20C, and 20D, respectively.

In the example illustrated in FIG. 2, each boost circuit 20 is driven by a driving signal group supplied from a first driving signal line DL1, a second driving signal line DL2, and a third driving signal line DL3. In the following, the driving signal supplied by the first driving signal line DL1 may be called the "first driving signal", the driving signal supplied by the second driving signal line DL2 may be called the "second driving signal", and the driving signal supplied by the third driving signal line DL3 may be called the "third driving signal". As described in detail later, the boosting by the boost circuits 20 is performed such that the driving amplitude of the gate potential of the switching TFTs 12 increases in correspondence with the amplitude of the first driving signal, the second driving signal, and the third driving signal.

In the example illustrated in FIG. 2, two driving signal line groups DG1 and DG2 are provided. The boost circuits 20A and 20B are driven by a first driving signal line DL1A, a second driving signal line DL2A, and a third driving signal line DL3A of one DG1 among the driving signal line groups DG1 and DG2. Also, the boost circuits 20C and 20D are driven by a first driving signal line DL1B, a second driving signal line DL2B, and a third driving signal line DL3B of the other DG2 among the driving signal line groups DG1 and DG2.

As described above, in the active matrix substrate 100 of the present embodiment, the DEMUX circuit 10 includes the boost circuits 20 configured to boost the voltages applied to the gate electrodes of the switching TFTs 12, and therefore the effective driving voltage of the DEMUX circuit can be raised.

For this reason, because the DEMUX circuit can be driven with driving signals of relatively small amplitude, the power consumption due to the charging and discharging of the driving signals can be reduced. Also, because the voltages (driving voltages) applied to the gate electrodes of the switching TFTs 12 can be raised by the boost circuits 20, the resistance (on-resistance) of a switching TFT 12 when selected can be lowered, and the charging performance can be raised.

Furthermore, because the driving voltage can be raised, the switching TFTs 12 can also be reduced in size. For this reason, the layout size of the DEMUX circuit 10 can be reduced, and a narrower peripheral region FR (thinner bezel) can be attained. In this way, according to an embodiment of the present invention, it is possible to achieve both a reduction in the driving power of an active matrix substrate provided with a DEMUX circuit as well as a thinner bezel.

Figure 3:
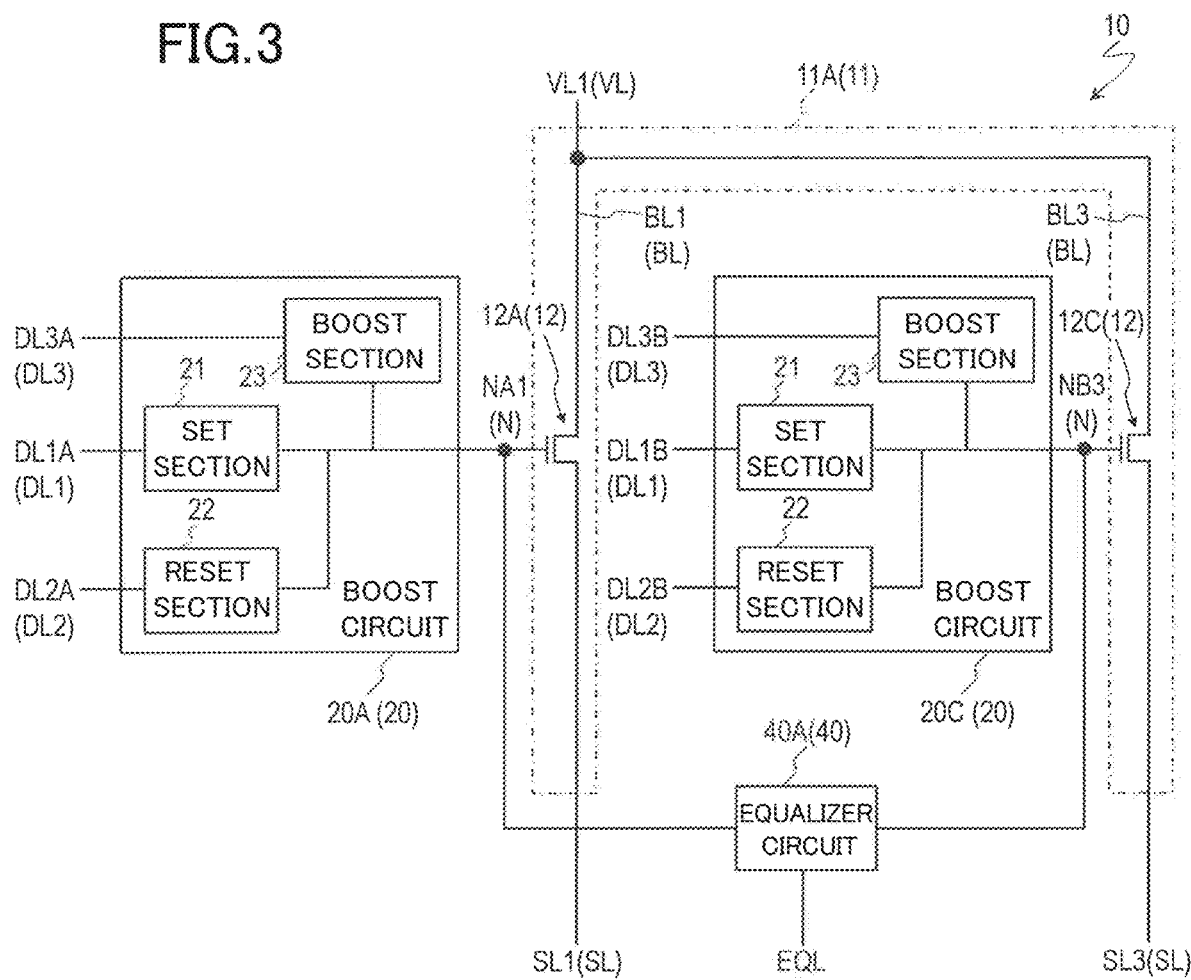
FIG. 3 is a diagram illustrating an example of a configuration of boost circuits 20 included in the DEMUX circuit 10.

Also, as illustrated in FIG. 2, the DEMUX circuit 10 in the present embodiment additionally includes equalizer circuits 40. The equalizer circuits 40 are supplied with a driving signal from an equalizer signal line EQL. The driving signal supplied from the equalizer signal line EQL is hereinafter referred to as the "equalizer signal". Hereinafter, a specific configuration of each boost circuit 20 and the functions of the equalizer circuits 40 will be described with reference to FIGS. 2 and 3. FIG. 3 is a diagram illustrating an example of the configuration of the boost circuits 20.

In the example illustrated in FIG. 3, each boost circuit 20 includes a set section 21, a reset section 22, and a boost section 23. The set section 21, the reset section 22, and the boost section 23 are connected to a node N that is connected to the gate electrode of one of the switching TFTs 12. Also, the set section 21 is connected to the first driving signal line DL1, the reset section 22 is connected to the second driving signal line DL2, and the boost section 23 is connected to the third driving signal line DL3.

The set section 21 is supplied with the first driving signal (set signal) from the first driving signal line DL1, and pre-charges the node N. The boost section 23 is supplied with the third driving signal (boost signal) from the third driving signal line DL3, and boosts the potential of the node N pre-charged by the set section 21. The reset section 22 is supplied with the second driving signal (reset signal) from the second driving signal line DL2, and resets the potential of the node N.

The two switching TFTs 12A and 12C included in the first unit circuit 11A are switched on at mutually different timings inside one horizontal scanning period. In the following, of the two switching TFTs 12A and 12C in the first unit circuit 11A, one 12A may be called the "first switching TFT", while the other 12C may be called the "second switching TFT". Also, the boost circuit 20A connected to the first switching TFT 12A may be called the "first boost circuit", and the boost circuit 20C connected to the second switching TFT 12C may be called the "second boost circuit". Furthermore, the node NA1 boosted by the boost section 23 of the first boost circuit 20A may be called the "first node", and the node NB3 boosted by the boost section 23 of the second boost circuit 20C may be called the "second node". As described in detail later, the second boost circuit 20C is driven by a driving signal group that is phase-shifted (also referred to as inverted phase) from the driving signal group that drives the first boost circuit 20A.

Similarly, of the two switching TFTs 12B and 12D in the second unit circuit 11B, one 12B may be called the "first switching TFT", while the other 12D may be called the "second switching TFT". Also, the boost circuit 20B connected to the first switching TFT 12B may be called the "first boost circuit", and the boost circuit 20D connected to the second switching TFT 12D may be called the "second boost circuit". Furthermore, the node NA2 boosted by the boost section 23 of the first boost circuit 20B may be called the "first node", and the node NB4 boosted by the boost section 23 of the second boost circuit 20D may be called the "second node". The second boost circuit 20D is driven by a driving signal group that is phase-shifted (also referred to as inverted phase) from the driving signal group that drives the first boost circuit 20B.

In FIG. 2, two equalizer circuits 40A and 40B are illustrated. Of the two equalizer circuits 40A and 40B, one 40A is connected to the first node NA1 that is connected to the gate electrode of the first switching TFT 12A and to the second node NB3 that is connected to the gate electrode of the second switching TFT 12C of the first unit circuit 11A. The equalizer circuit 40A can switch between a state in which the first node NA1 and the second node NB3 are electrically connected and a state in which the first node NA1 and the second node NB3 are not electrically connected. By electrically connecting the first node NA1 and the second node NB3, the equalizer circuit 40A can perform charge sharing between the first node NA1 and the second node NB3.

Also, of the two equalizer circuits 40A and 40B, the other 40B is connected to the first node NA2 that is connected to the gate electrode of the first switching TFT 12B and to the second node NB4 that is connected to the gate electrode of the second switching TFT 12D of the second unit circuit 11B. The equalizer circuit 40B can switch between a state in which the first node NA2 and the second node NB4 are electrically connected and a state in which the first node NA2 and the second node NB4 are not electrically connected. By electrically connecting the first node NA2 and the second node NB4, the equalizer circuit 40B can perform charge sharing between the first node NA2 and the second node NB4.

In the active matrix substrate 100 of the present embodiment, the DEMUX circuit 10 includes the equalizer circuits 40 like the ones described above. For this reason, before the first boost circuit 20A (20B) charges the first node NA1 (NA2) (that is, before the pre-charging by the set section 21), the first node NA1 (NA2) and the second node NB3 (NB4) can be electrically connected by the equalizer circuits 40, and charge sharing can be performed between the first node NA1 (NA2) and the second node NB3 (NB4). With this arrangement, the charge of the second node NB3 (NB4) already charged by the second boost circuit 20C (20D) can be used to charge the first node NA1 (NA2). Also, before the second boost circuit 20C (20D) charges the second node NB3 (NB4) (that is, before the pre-charging by the set section 21), the second node NB3 (NB4) and the first node NA1 (NA2) can be electrically connected by the equalizer circuits 40, and charge sharing can be performed between the second node NB3 (NB4) and the first node NA1 (NA2). With this arrangement, the charge of the first node NA1 (NA2) already charged by the first boost circuit 20A (20B) can be used to charge the second node NB3 (NB4).

Through such equalization operation, in the active matrix substrate 100, a node N can be charged using the charge of the other node N before the node N is charged by the boost circuit 20, and therefore the amplitude of the charging by the boost circuit 20 can be decreased. For this reason, because the current for charging (charging current) supplied to each boost circuit 20 can be reduced, a further reduction in the driving power of the DEMUX circuit 10 is possible.

At this point, operations by the boost circuits 20 (of the DEMUX circuit 10) will be described further with reference to FIG. 4. FIG. 4 is a timing chart for explaining operations by the DEMUX circuit 10. FIG. 4 illustrates the potentials of the first driving signal lines DL1A and DL1B, the second driving signal lines DL2A and DL2B, the third driving signal lines DL3A and DL3B, the first node NA1, the second node NB3, one of the signal output lines VL, and the source bus lines SL1 and SL3. Additionally, FIG. 4 also illustrates the potentials of the gate bus lines GLn and GLn+1.

First, at a time t1, the potential of the first driving signal line DL1A goes to high level while the potential of the second driving signal line DL2A goes to low level, and the first driving signal is input into the set section 21 of the first boost circuit 20A as the set signal. With this arrangement, the first node NA1 connected to the gate electrode of the first switching TFT 12A is pre-charged. Also, the potential of the signal output line VL (that is, the display signal) at this timing changes to a write voltage level, and the charging of the selected source bus line SL1 is started.

Next, at a time t2, the potential of the third driving signal line DL3A goes to high level, and the third driving signal is input into the boost section 23 of the first boost circuit 20A as the boost signal. With this arrangement, the potential of the first node NA1 is boosted. By boosting the potential of the first node NA1, the source bus line SL1 is sufficiently charged through the first switching TFT 12A.

Next, at a time t3, the potential of the first driving signal line DL1A goes to low level, the potential of the third driving signal line DL3A goes to low level, and the potential of the first node NA1 drops to the pre-charge potential. At this time, by causing the potential of the equalizer signal line EQL (that is, the equalizer signal) to go to high level, the first node NA1 and the second node NB3 are electrically connected by the equalizer circuit 40, and charge sharing is performed. With this arrangement, charge moves from the first node NA1 to the second node NB3, and the potential is equalized between the first node NA1 and the second node NB3.

Next, at a time t4, the potential of the second driving signal line DL2A goes to high level, and the second driving signal is input into the reset section 22 of the first boost circuit 20A as the reset signal. With this arrangement, the potential of the first node NA1 is reset. At this time, the first switching TFT 12A is switched off, and the potential of the source bus line SL1 is finalized.

In addition, at the time t4, the potential of the first driving signal line DL1B goes to high level while the potential of the second driving signal line DL2B goes to low level, and the first driving signal is input into the set section 21 of the second boost circuit 20C as the set signal. With this arrangement, the second node NB3 connected to the gate electrode of the second switching TFT 12C is pre-charged. Also, the potential of the signal output line VL (that is, the display signal) at this timing changes to a write voltage level, and the charging of the selected source bus line SL3 is started.

Next, at a time t5, the potential of the third driving signal line DL3B goes to high level, and the third driving signal is input into the boost section 23 of the second boost circuit 20C as the boost signal.

With this arrangement, the potential of the second node NB3 is boosted. By boosting the potential of the second node NB3, the source bus line SL3 is sufficiently charged through the second switching TFT 12C.

After that, at a time t6, the potential of the first driving signal line DL1B goes to low level, the potential of the second driving signal line DL2B goes to high level, the potential of the third driving signal line DL3B goes to low level, and the second driving signal is input into the reset section 22 of the second boost circuit 20C as the reset signal. With this arrangement, the potential of the second node NB3 is reset. At this time, the second switching TFT 12C is switched off, and the potential of the source bus line SL3 is finalized.

When the writing to the source bus lines SL1 and SL3 is completed (that is, when the potential is finalized), the gate signal supplied from the gate bus line GLn goes to an off level, and the writing of the display voltage to the pixels PIX is completed. Thereafter, writing is performed for all of the gate bus lines GL by repeating the operations described above.

Figure 5A:
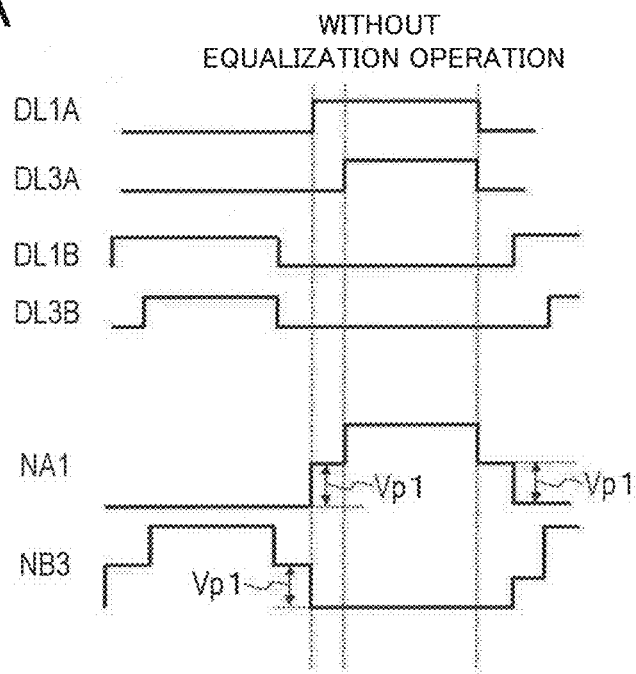
FIG. 5A is an example of a timing chart in the case of not performing an equalization operation by an equalizer circuit 40.

At this point, the effects provided by the embodiments of the present invention will be described further with reference to FIGS. 5A and 5B. FIG. 5A is an example of a timing chart in a case of not performing the equalization operation by the equalizer circuits 40, while FIG. 5B is an example of a timing chart in the case of performing the equalization operation by the equalizer circuits 40.

FIG. 5A illustrates an amplitude Vp1 of the charging and discharging by the driving signal in the case of not performing the equalization operation. FIG. 5B illustrates an amplitude Vp2 of charging and discharging by the driving signal (that is, by the boost circuit 20C) and an amplitude Vp3 of charging and discharging by charge sharing in the case of performing the equalization operation.

Figure 5B:
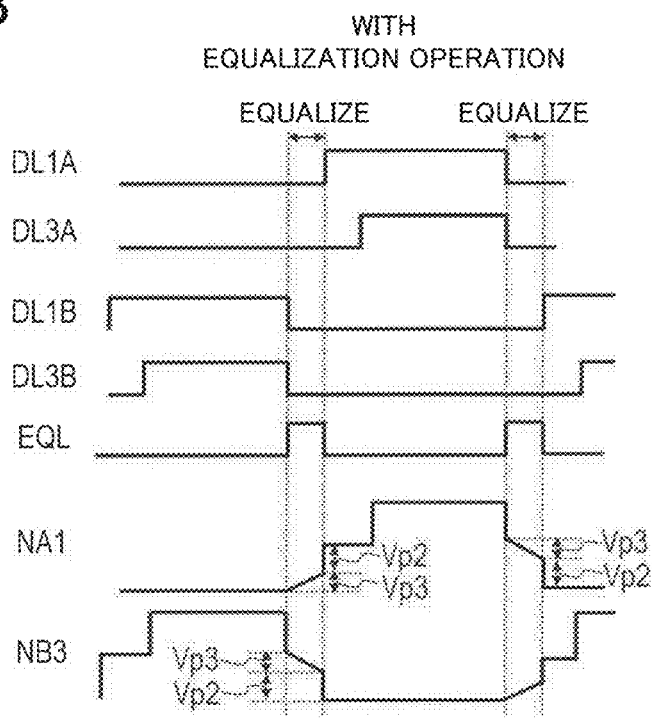
FIG. 5B is an example of a timing chart in the case of performing an equalization operation by an equalizer circuit 40.

Assuming that the potential of the node N after pre-charging is the same for both the case illustrated in FIG. 5A and the case illustrated in FIG. 5B, the amplitudes Vp1, Vp2, and Vp3 satisfy the equation Vp1=Vp2+Vp3. For this reason, Vp1>Vp2, and the amplitude Vp2 of the charging and discharging by the driving signal in the case of performing the equalization operation is lower than the amplitude Vp1 of the charging and discharging by the driving signal in the case of not performing the equalization operation.

A driving power P1 in the case of not performing the equalization operation and a driving power P2 in the case of performing the equalization operation are respectively expressed by the formulas below. In the formulas below, f is the driving frequency, n is the number of boost circuits 20, and C is the capacitance of the node N.

$$P1=fnCVp1^2$$

$$P2=fnCVp2^2$$

Consequently, by performing the equalization operation, it is possible to reduce the driving power by (Vp2$^2$/Vp1$^2$) times the driving power in the case of not performing the equalization operation.

Figure 6:
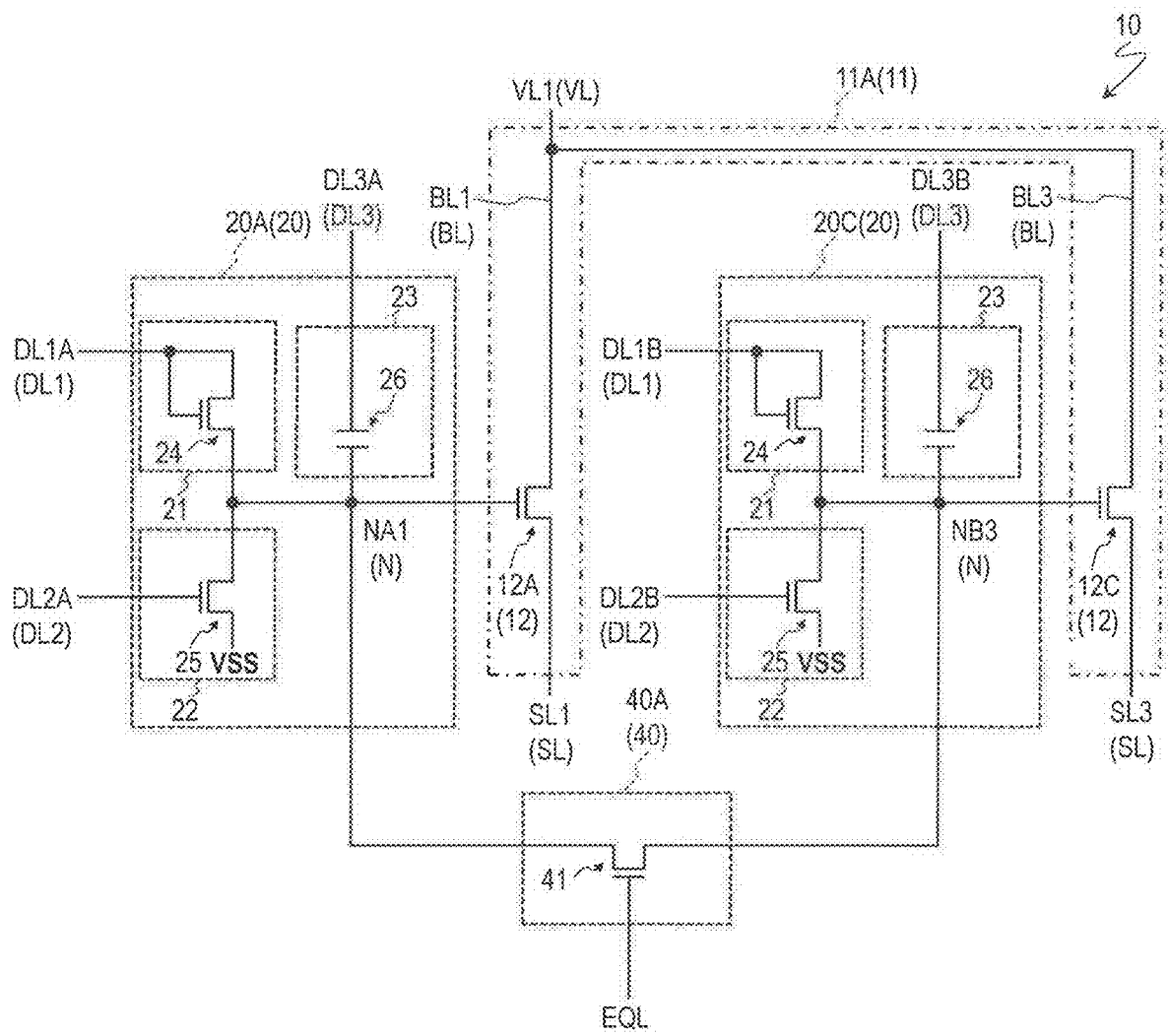
FIG. 6 is a diagram illustrating an example of a specific configuration of a set section 21, a reset section 22, and a boost section 23 included in the boost circuit 20, and the equalizer circuit 40.

A more specific configuration of each boost circuit 20 and each equalizer circuit 40 will be described with reference to FIG. 6. FIG. 6 is a diagram illustrating an example of a specific configuration of the set section 21, the reset section 22, and the boost section 23 of the boost circuits 20, and one of the equalizer circuits 40.

In the example illustrated in FIG. 6, the set section 21 includes a TFT (hereinafter referred to as the "set TFT") 24. The set TFT 24 is diode-connected, in which the gate electrode and the drain electrode of the set TFT 24 are connected to the first driving signal line DL1. Also, the source electrode of the set TFT 24 is connected to the node N.

The reset section 22 includes a TFT (hereinafter referred to as the "reset TFT") 25. The gate electrode of the reset TFT 25 is connected to the second driving signal line DL2. The reset TFT 25 is configured to be capable of pulling down the potential of the node N. Specifically, a constant potential (negative power supply potential VSS) is applied to the source electrode of the reset TFT 25, and the drain electrode of the reset TFT 25 is connected to the node N.

The boost section 23 includes a capacitive element (hereinafter referred to as the "boost capacitive element") 26.

The boost capacitive element 26 includes an electrode (first capacitive electrode) connected to the third driving signal line DL3 and an electrode (second capacitive electrode) connected to the node N.

The equalizer circuit 40 includes a TFT (hereinafter referred to as the "equalizer TFT") 41.

The gate electrode of the equalizer TFT 41 is connected to the equalizer signal line EQL. Of the source electrode and the drain electrode of the equalizer TFT 41, one is connected to the first node NA1 that is boosted by the boost section 23 of the first boost circuit 20A, while the other is connected to the second node NB3 that is boosted by the boost section 23 of the second boost circuit 20C.

In the configuration illustrated as an example in FIG. 6, the equalization operation is performed as follows. At the time t3 in the timing chart illustrated in FIG. 4, the first node NA1 is at a relatively high potential while the second node NB3 is at a relatively low potential. From this state, if the equalizer signal goes to high level, the equalizer TFT 41 is switched on, thereby electrically connecting the first node NA1 and the second node NB3, and charge is transferred from the first node NA1 to the second node NB3 until the potential is equalized between the first node NA1 and the second node NB3.

Also, the pre-charging by the set section 21 and the boosting by the boost section 23 are performed as follows. In the following description, "VDH" denotes the high level and "VDL" denotes the low level of the potential of the first driving signal line DL1, the second driving signal line DL2, and the third driving signal line DL3.

At the time t1 or the time t4 in the timing chart illustrated in FIG. 4, when the potential of the first driving signal line DL1 (set signal) changes from low level to high level, the set TFT 24 is switched on and the node N is pre-charged. At this time, because the set TFT 24 is diode-connected, the node N is pre-charged to the potential (VDH−Vth), where Vth is the threshold voltage of the set TFT 24.

Also, at the time t2 or the time t5 in the timing chart illustrated in FIG. 4, when the potential of the third driving signal line DL3 (boost signal) changes from low level to high level, the potential of the node N is boosted. The degree of boost is different depending on the ratio of a capacitance value Cbst of the boost capacitive element 26 with respect to the sum of the load capacitances (total load capacitance) Cn of the node N. Specifically, the boosted part of the potential is obtained by multiplying the boost voltage (=VDH−VDL) by (Cbst/Cn). Consequently, for example, if the total load capacitance Cn of the node N is 0.2 pF and the capacitance value Cbst of the boost capacitive element 26 is 0.1 pF, the potential of the node N is boosted from (VDH−Vth) to {(VDH−Vth)+(VDH−VDL)·(0.1/0.2)}. In the case where VDH=10 V, VDL=−10 V, and Vth=2 V, the node N is boosted to 18 V.

Note that the specific configuration of the set section 21, the reset section 22, the boost section 23, and the equalizer circuit 40 is not limited to the example illustrated in FIG. 6. For example, the boost section 23 may include a TFT (boost TFT) instead of, or in addition to, the boost capacitive element 26.

Embodiment 2

Figure 7:
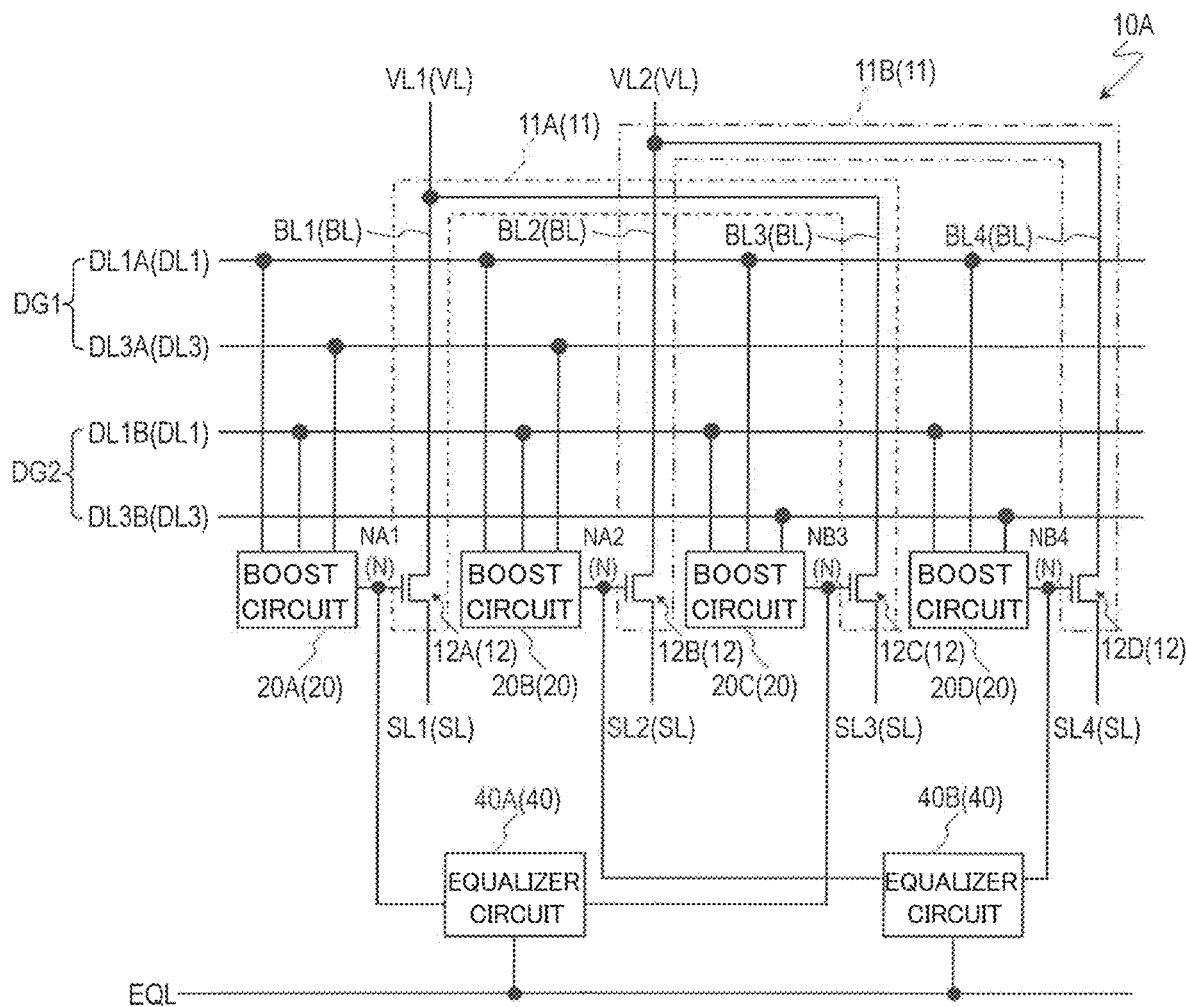
FIG. 7 is a diagram illustrating a configuration of a DEMUX circuit 10A provided in an active matrix substrate according to Embodiment 2.

An active matrix substrate according to the present embodiment will be described with reference to FIG. 7. FIG. 7 is a diagram illustrating a configuration of a DEMUX circuit 10A provided in the active matrix substrate of the present embodiment.

As illustrated in FIG. 7, the DEMUX circuit 10A in the present embodiment differs from the DEMUX circuit 10 illustrated in FIG. 2 by not including the second driving signal line DL2.

Here, if attention is focused on the first boost circuit 20A and the second boost circuit 20C connected to the first switching TFT 12A and the second switching TFT 12C of the first unit circuit 11A, the first boost circuit 20A is connected to a first driving signal line DL1A and a third driving signal line DL3A for the first boost circuit 20A, and is also connected to the first driving signal line DL1B for the second boost circuit 20C. Also, the second boost circuit 20C is connected to the first driving signal line DL1B and the third driving signal line DL3B for the second boost circuit 20C, and is also connected to the first driving signal line DL1A for the first boost circuit 20A.

Figure 8:
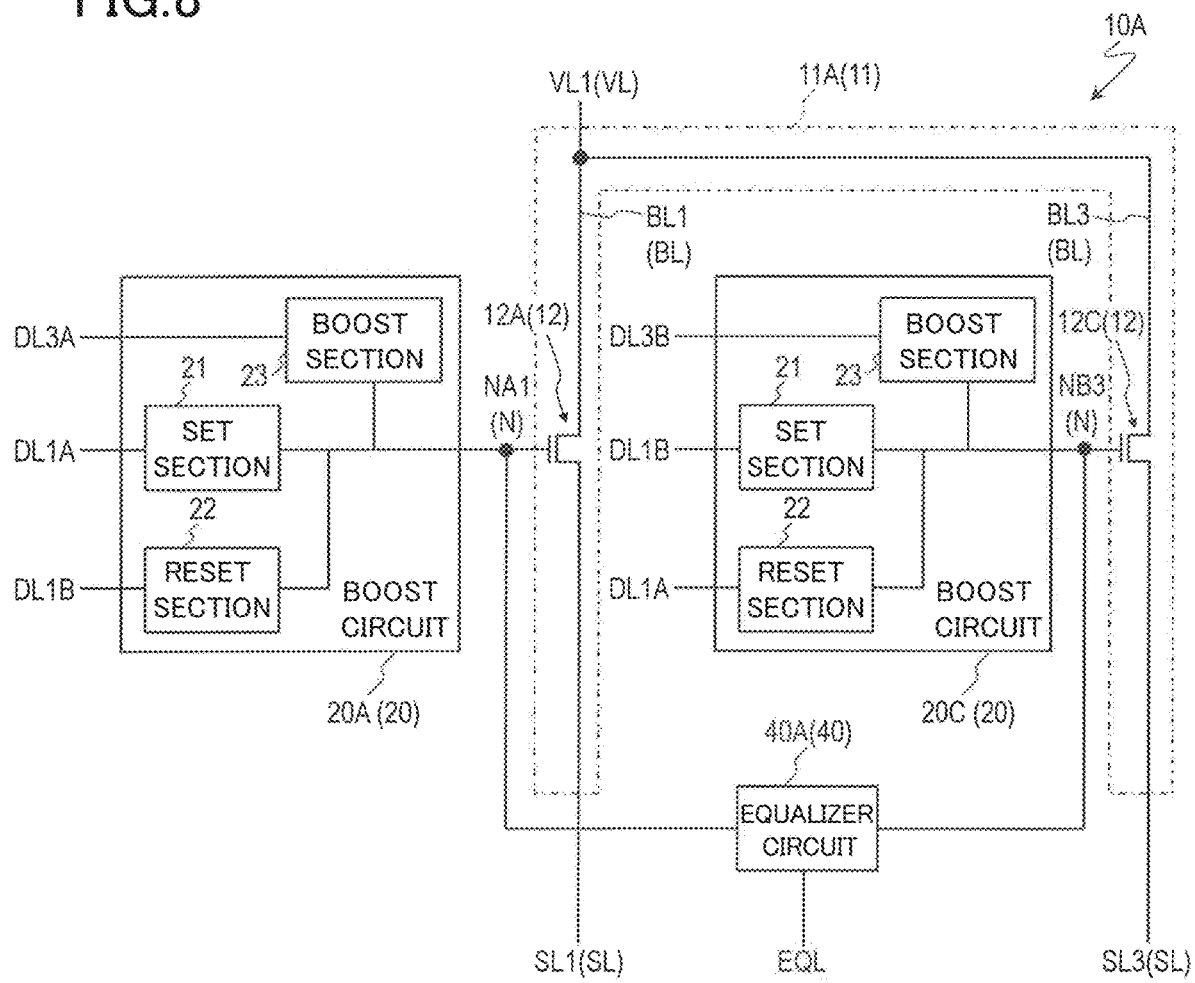
FIG. 8 is a diagram illustrating an example of a configuration of boost circuits 20 included in the DEMUX circuit 10A.

FIG. 8 is a diagram illustrating an example of a configuration of the boost circuits 20 included in the DEMUX circuit 10A.

As illustrated in FIG. 8, the first driving signal line DL1B for the second boost circuit 20C is connected to the reset section 22 of the first boost circuit 20A. Also, the first driving signal line DL1A for the first boost circuit 20A is connected to the reset section 22 of the second boost circuit 20C.

Figure 9:
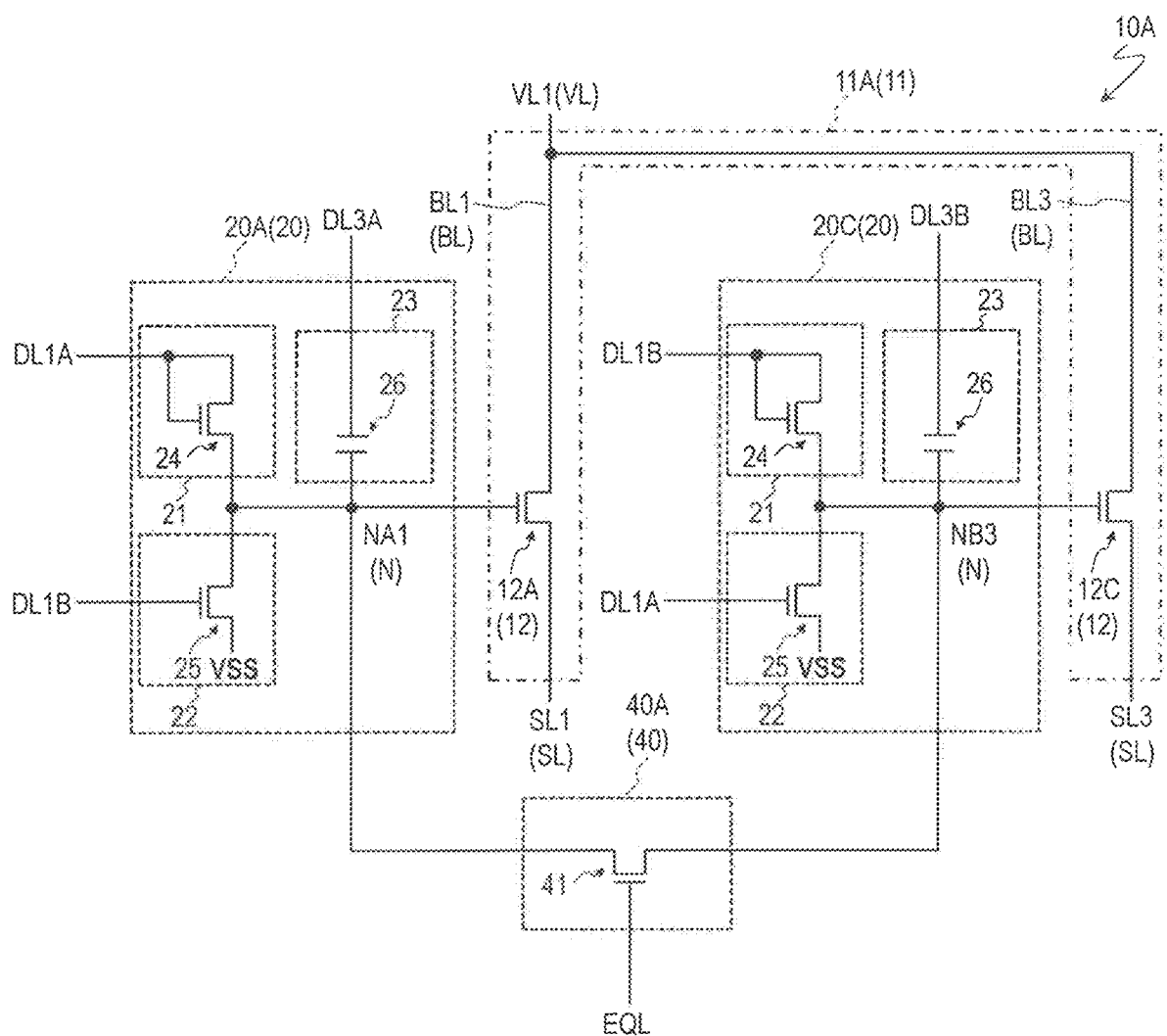
FIG. 9 is a diagram illustrating an example of a specific configuration of a set section 21, a reset section 22, and a boost section 23 included in the boost circuits 20, and the equalizer circuit 40 in the DEMUX circuit 10A.

FIG. 9 is a diagram illustrating an example of a specific configuration of the set section 21, the reset section 22, and the boost section 23 of the boost circuits 20, and one of the equalizer circuits 40 in the DEMUX circuit 10A.

As illustrated in FIG. 9, the gate electrode of the reset TFT 25 of the first boost circuit 20A is connected to the first driving signal line DL1B for the second boost circuit 20C, and the gate electrode of the reset TFT 25 of the second boost circuit 20C is connected to the first driving signal line DL1A for the first boost circuit 20A.

In this way, in the present embodiment, the first driving signal line DL1A for the first boost circuit 20A doubles as the second driving signal line for the second boost circuit 20C, and the first driving signal line DL1B for the second boost circuit 20C doubles as the second driving signal line for the first boost circuit 20A. If the configuration of the present embodiment is adopted, the second driving signal line can be omitted, and the number of lines can be decreased.

At this point, the reason why the first driving signal line DL1 for one boost circuit 20 can double as the second driving signal line for another boost circuit 20 will be explained with additional reference to FIG. 10.

Figure 10:
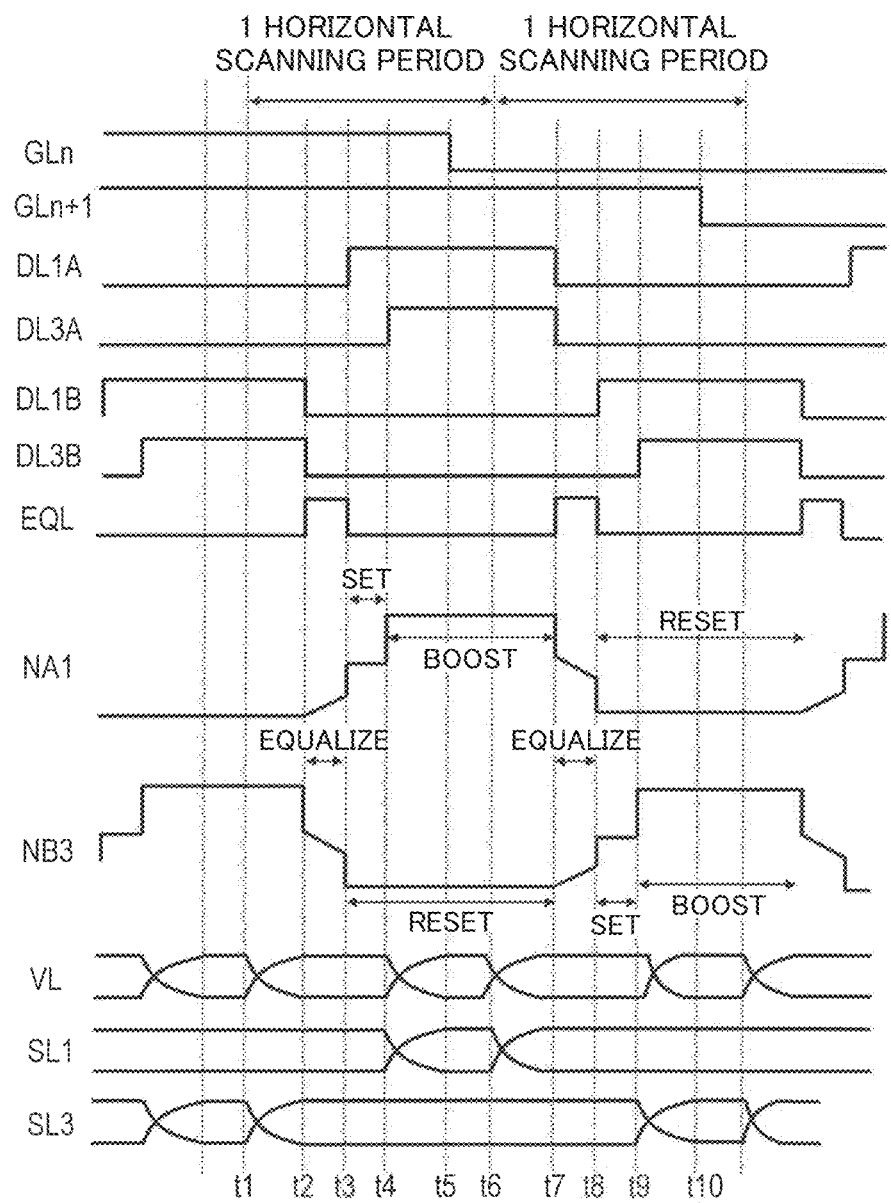
FIG. 10 is a timing chart for explaining operations by the DEMUX circuit 10A.

FIG. 10 is a timing chart for explaining operations by the DEMUX circuit 10A.

[Time t1]
First switching TFT 12A side: The first node NA1 remains in a state with the potential reset.

Second switching TFT 12C side: The second node NB3 is holding a voltage boosted in the previous horizontal scanning period, and therefore the source bus line SL3 is charged to the write voltage level of the signal output line VL.

[Time t2]
First switching TFT 12A side: The potentials of the first driving signal line DL1A and the third driving signal line DL3A remain at low level.

Second switching TFT 12C side: The potentials of the first driving signal line DL1B and the third driving signal line DL3B both go from high level to low level, and the potential of the second node NB3 goes from the boosted potential to the pre-charge potential.

At this time, by causing the potential of the equalizer signal line EQL (that is, the equalizer signal) to go to high level, the first node NA1 and the second node NB3 are electrically connected by the equalizer circuit 40A, and charge sharing is performed. With this arrangement, charge moves from the second node NB3 to the first node NA1, and the potential is equalized between the first node NA1 and the second node NB3.

[Time t3]
First switching TFT 12A side: The potential of the first driving signal line DL1A goes to high level, and the first driving signal is input into the set section 21 of the first boost circuit 20A as the set signal.

With this arrangement, the first node NA1 is pre-charged.
Second switching TFT 12C side: The potential of the first driving signal line DL1A goes to high level, and the first driving signal is input into the reset section 22 of the second boost circuit 20C as the reset signal. With this arrangement, the potential of the second node NB3 is reset.

[Time t4]
First switching TFT 12A side: The potential of the third driving signal line DL3A goes to high level, and the third driving signal is input into the boost section 23 of the first boost circuit 20A as the boost signal. With this arrangement, the potential of the first node NA1 is boosted. By boosting the potential of the first node NA1, the source bus line SL1 is sufficiently charged through the first switching TFT 20A.

Second switching TFT 12C side: The potentials of the first driving signal line DL1B and the third driving signal line DL3B remain at low level, and the second node NB3 maintains the reset state.

[Time t5]
When the writing to the source bus lines SL1 and SL3 is completed (that is, when the potential is finalized), the gate signal supplied from the gate bus line GLn goes to an off level, and the writing of the display voltage to the pixels PIX is completed.

[Time t6]
First switching TFT 12A side: The first node NA1 is holding a voltage boosted in the previous horizontal scanning period, and therefore the source bus line SL1 is charged to the write voltage level of the signal output line VL.

Second switching TFT 12C side: The second node NB3 maintains the reset state.

[Time t7]
By causing the potential of the equalizer signal line EQL (that is, the equalizer signal) to go to high level, the first node NA1 and the second node NB3 are electrically connected by the equalizer circuit 40, and charge sharing is performed. With this arrangement, charge moves from the first node NA1 to the second node NB3, and the potential is equalized between the first node NA1 and the second node NB3.

[Time t8]
First switching TFT 12A side: The potential of the first driving signal line DL1B goes to high level, and the first driving signal is input into the reset section 22 of the first boost circuit 20A as the reset signal. With this arrangement, the potential of the first node NA1 is reset.

Second switching TFT 12C side: The potential of the first driving signal line DL1B goes to high level, and the first driving signal is input into the set section 21 of the second boost circuit 20C as the set signal.

With this arrangement, the second node NB3 is pre-charged.

[Time t9]
First switching TFT 12A side: The first node NA1 maintains the reset state.

Second switching TFT 12C side: The potential of the third driving signal line DL3B goes to high level, and the third driving signal is input into the boost section 23 of the second boost circuit 20C as the boost signal. With this arrangement, the potential of the second node NB3 is boosted. By boosting the potential of the second node NB3, the source bus line SL3 is sufficiently charged through the second switching TFT 20C.

[Time t10]
When the writing to the source bus lines SL1 and SL3 is completed (that is, when the potential is finalized), the gate signal supplied from the gate bus line GLn+1 goes to an off level, and the writing of the display voltage to the pixels PIX is completed. Thereafter, writing is performed for all of the gate bus lines GL by repeating the operations described above.

As described above, the first driving signal line DL1A for the first boost circuit 20A can double as the second driving signal line for the second boost circuit 20C, and the first driving signal line DL1B for the second boost circuit 20C can double as the second driving signal line for the first boost circuit 20A.

As FIG. 10 demonstrates, this is because the signal supplied by the first driving signal line DL1A for the first boost circuit 20A and the signal supplied by the first driving signal line DL1B for the second boost circuit 20C are signals of inverse phase with each other. Because the first driving signal line DL1A for the first boost circuit 20A and the first driving signal line DL1B for the second boost circuit 20C go to high level at different timings, the signal supplied by the first driving signal line DL1B for the second boost circuit 20C can be used as the reset signal for the first boost circuit 20A, and the signal supplied by the first driving signal line DL1A for the first boost circuit 20A can be used as the reset signal for the second boost circuit 20C.

Embodiment 3

An active matrix substrate according to the present embodiment will be described with reference to FIG. 11.

Figure 11:
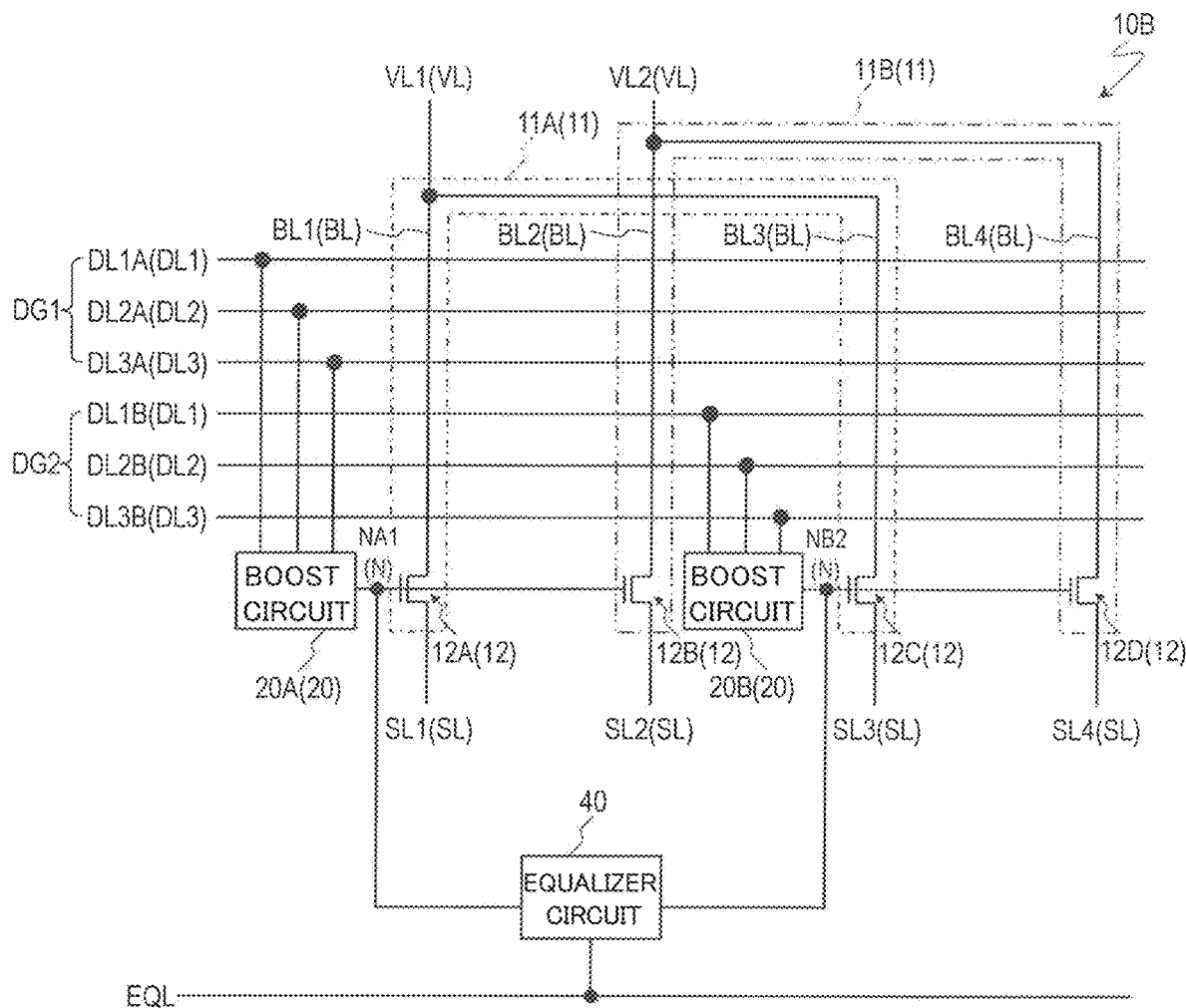
FIG. 11 is a diagram illustrating a configuration of a DEMUX circuit 10B provided in an active matrix substrate according to Embodiment 3.

FIG. 11 is a diagram illustrating a configuration of a DEMUX circuit 10B provided in the active matrix substrate of the present embodiment.

In the DEMUX circuit 10 illustrated in FIG. 2, one boost circuit 20 is connected to each switching TFT 12. In contrast, in the DEMUX circuit 10B of the present embodiment, as illustrated in FIG. 11, one boost circuit 20 is connected to two switching TFTs 12. Hereinafter, a more specific description will be given.

Of the two boost circuits 20A and 20B illustrated in FIG. 11, one (first boost circuit) 20A is connected in common with the first switching TFT 12A of the first unit circuit 11A and the first switching TFT 12B of the second unit circuit 11B. Also, the other (second boost circuit) 20B is connected in common with the second switching TFT 12C of the first unit circuit 11A and the second switching TFT 12D of the second unit circuit 11B.

The gate electrode of the first switching TFT 12A of the first unit circuit 11A and the gate electrode of the first switching TFT 12B of the second unit circuit 11B are connected to a common first node NA1. The gate electrode of the second switching TFT 12C of the first unit circuit 11A and the gate electrode of the second switching TFT 12D of the second unit circuit 11B are connected to a common second node NB2.

The equalizer circuit 40 is connected to the first node NA1 and the second node NB2, and by electrically connecting the first node NA1 and the second node NB2, the equalizer circuit 40 can perform charge sharing between the first node NA1 and the second node NB2.

In the present embodiment, by also including the equalizer circuit 40 in the DEMUX circuit 10B, it is possible to reduce the driving power further.

Also, in the present embodiment, one boost circuit 20 is shared between two switching TFTs 12 selected at the same time. For this reason, the number of circuit elements can be decreased. Also, because decreasing the number of circuit elements reduces the load, a further reduction in power consumption can be attained.

Furthermore, because decreasing the number of circuit elements also reduces the circuit area, the layout size can be reduced, and an even thinner bezel can be attained.

Embodiment 4

Figure 12:
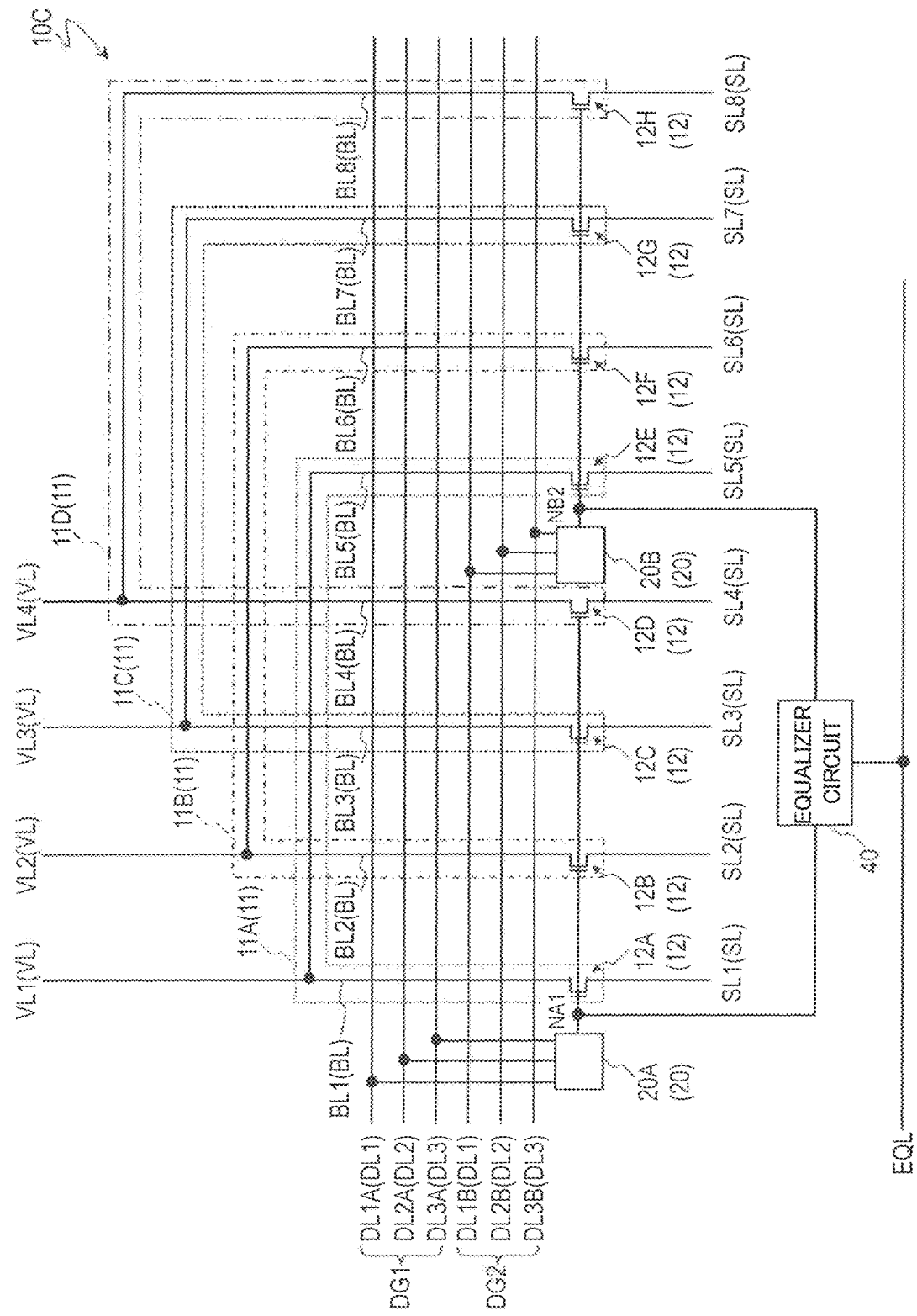
FIG. 12 is a diagram illustrating a configuration of a DEMUX circuit 10C provided in an active matrix substrate according to Embodiment 4.

In the DEMUX circuit 10B in Embodiment 3, one boost circuit 20 is shared between two switching TFTs 12, but one boost circuit 20 may also be shared among three or more switching TFTs 12. Hereinafter, an active matrix substrate according to the present embodiment will be described with reference to FIG. 12. FIG. 12 is a diagram illustrating a configuration of a DEMUX circuit 10C provided in the active matrix substrate of the present embodiment.

In FIG. 12, four unit circuits (hereinafter respectively referred to as the "first unit circuit", the "second unit circuit", the "third unit circuit", and the "fourth unit circuit") 11A, 11B, 11C, and 11D from among the plurality of unit circuits 11 included in the DEMUX circuit 10C are illustrated.

The first unit circuit 11A includes two branch lines BL1 and BL5 and two switching TFTs 12A and 12E, and splits the display signal from the signal output line VL1 to the source bus lines SL1 and SL5. The two switching TFTs 12 (first switching TFT and second switching TFT) 12A and 12E of the first unit circuit 11A are switched on at mutually different timings inside one horizontal scanning period.

The second unit circuit 11B includes two branch lines BL2 and BL6 and two switching TFTs 12B and 12F, and splits the display signal from the signal output line VL2 to the source bus lines SL2 and SL6. The two switching TFTs 12 (first switching TFT and second switching TFT) 12B and 12F of the second unit circuit 11B are switched on at mutually different timings inside one horizontal scanning period.

The third unit circuit 11C includes two branch lines BL3 and BL7 and two switching TFTs 12C and 12G, and splits the display signal from the signal output line VL3 to the source bus lines SL3 and SL7. The two switching TFTs 12 (first switching TFT and second switching TFT) 12C and 12G of the third unit circuit 11C are switched on at mutually different timings inside one horizontal scanning period.

The fourth unit circuit 11D includes two branch lines BL4 and BL8 and two switching TFTs 12D and 12H, and splits the display signal from the signal output line VL4 to the source bus lines SL4 and SL8. The two switching TFTs 12 (first switching TFT and second switching TFT) 12D and 12H of the fourth unit circuit 11D are switched on at mutually different timings inside one horizontal scanning period.

Of the two boost circuits 20A and 20B illustrated in FIG. 12, one (first boost circuit) 20A is connected in common with the first switching TFT 12A of the first unit circuit 11A, the first switching TFT 12B of the second unit circuit 11B, the first switching TFT 12C of the third unit circuit 11C, and the first switching TFT 12D of the fourth unit circuit 11D.

Also, the other (second boost circuit) 20B is connected in common with the second switching TFT 12E of the first unit circuit 11A, the second switching TFT 12F of the second unit circuit 11B, the second switching TFT 12G of the third unit circuit 11C, and the second switching TFT 12H of the fourth unit circuit 11D.

The gate electrode of the first switching TFT 12A of the first unit circuit 11A, the gate electrode of the first switching TFT 12B of the second unit circuit 11B, the gate electrode of the first switching TFT 12C of the third unit circuit 11C, and the gate electrode of the first switching TFT 12D of the fourth unit circuit 11D are connected to a common first node NA1. The gate electrode of the second switching TFT 12E of the first unit circuit 11A, the gate electrode of the second switching TFT 12F of the second unit circuit 11B, the gate electrode of the second switching TFT 12G of the third unit circuit 11C, and the gate electrode of the second switching TFT 12H of the fourth unit circuit 11D are connected to a common first node NB2.

The equalizer circuit 40 is connected to the first node NA1 and the second node NB2, and by electrically connecting the first node NA1 and the second node NB2, the equalizer circuit 40 can perform charge sharing between the first node NA1 and the second node NB2.

In the present embodiment, by also including the equalizer circuit 40 in the DEMUX circuit 10A, it is possible to reduce the driving power further.

Also, in the present embodiment, one boost circuit 20 is shared among four switching TFTs 12 selected at the same time. For this reason, compared to Embodiment 3 in which one boost circuit 20 is shared between two switching TFTs 12, the number of circuit elements can be decreased further. Therefore, a further reduction in power consumption and an even thinner bezel can be attained.

Note that although the present embodiment illustrates an example in which one boost circuit 20 is shared among four switching TFTs 12, the number of circuit elements can be decreased compared to Embodiment 3 by sharing one boost circuit 20 among three or more switching TFTs 12. One boost circuit 20 may be shared among three switching TFTs 12 selected at the same time, or one boost circuit 20 may be shared among five or more switching TFTs 12 selected at the same time.

Embodiment 5

Figure 13A:
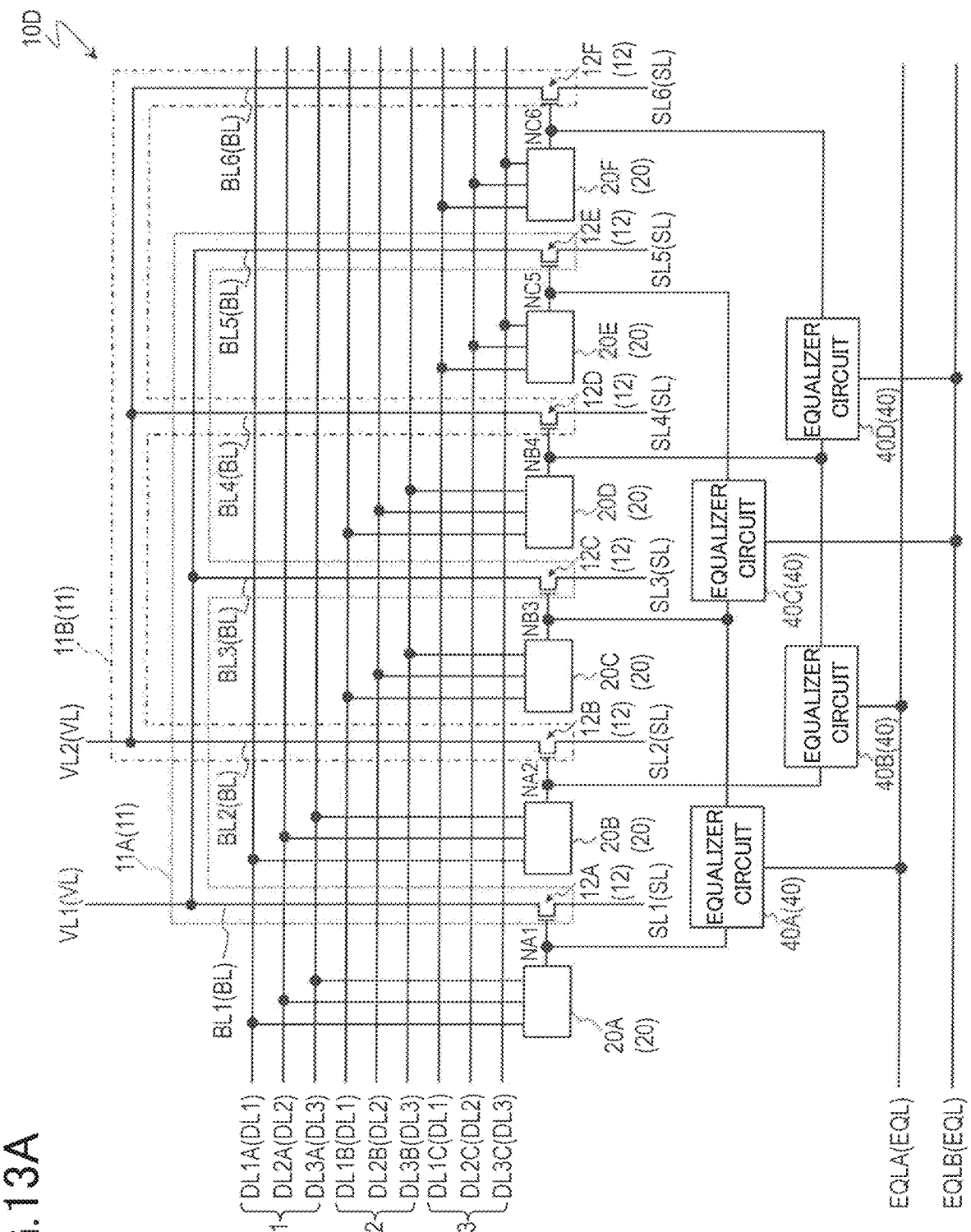
FIG. 13A is a diagram illustrating a configuration of a DEMUX circuit 10D provided in an active matrix substrate according to Embodiment 5.

An active matrix substrate according to the present embodiment will be described with reference to FIG. 13A. FIG. 13A is a diagram illustrating a configuration of a DEMUX circuit 10D provided in the active matrix substrate of the present embodiment.

In the DEMUX circuits 10, 10A, 10B, and 10C illustrated in FIGS. 2, 7, 11, and 12, each unit circuit 11 splits the display signal from a single signal output line VL to two source bus lines SL. In contrast, in the DEMUX circuit 10D of the present embodiment, each unit circuit 11 splits the display signal from a single signal output line VL to three source bus lines SL.

Hereinafter, a more specific description will be given.

In FIG. 13A, two unit circuits (first unit circuit and second unit circuit) 11A and 11B from among the plurality of unit circuits 11 included in the DEMUX circuit 10D are illustrated.

The first unit circuit 11A includes three branch lines BL1, BL3, and BL5 and three switching TFTs 12A, 12C, and 12E, and splits the display signal from the single signal output line VL1 to the three source bus lines SL1, SL3, and SL5.

The second unit circuit 11B includes three branch lines BL2, BL4, and BL6 and three switching TFTs 12B, 12D, and 12F, and splits the display signal from the single signal output line VL2 to the three source bus lines SL2, SL4, and SL6.

The DEMUX circuit 10D includes a plurality of boost circuits 20 configured to boost the voltages applied to the gate electrodes of the three switching TFTs 12 of each unit circuit 11. In the example illustrated in FIG. 13A, one boost circuit 20 is connected to each switching TFT 12. Specifically, the gate electrodes of the switching TFTs 12A, 12B, 12C, 12D, 12E, and 12F are connected on the output side of boost circuits 20A, 20B, 20C, 20D, 20E, and 20F, respectively.

In the example illustrated in FIG. 13A, three driving signal line groups DG1, DG2, and DG3 are provided. The boost circuits 20A and 20B are driven by a first driving signal line DL1A, a second driving signal line DL2A, and a third driving signal line DL3A of the driving signal line group DG1. Also, the boost circuits 20C and 20D are driven by a first driving signal line DL1B, a second driving signal line DL2B, and a third driving signal line DL3B of the driving signal line group DG2, and the boost circuits 20E and 20F are driven by a first driving signal line DL1C, a second driving signal line DL2C, and a third driving signal line DL3C of the driving signal line group DG3.

The three switching TFTs 12A, 12C, and 12E included in the first unit circuit 11A are switched on at mutually different timings inside one horizontal scanning period. In the following, the three switching TFTs 12A, 12C, and 12E in the first unit circuit 11A may be called the "first switching TFT", the "second switching TFT", and the "third switching TFT", respectively. Also, the boost circuit 20A connected to the first switching TFT 12A may be called the "first boost circuit", the boost circuit 20C connected to the second switching TFT 12C may be called the "second boost circuit", and the boost circuit 20E connected to the third switching TFT 12E may be called the "third boost circuit". Furthermore, the node NA1 boosted by the first boost circuit 20A may be called the "first node", the node NB3 boosted by the second boost circuit 20C may be called the "second node", and the node NC5 boosted by the third boost circuit 20E may be called the "third node".

Similarly, the three switching TFTs 12B, 12D, and 12F in the second unit circuit 11B may be called the "first switching TFT", the "second switching TFT", and the "third switching TFT", respectively. Also, the boost circuit 20B connected to the first switching TFT 12B may be called the "first boost circuit", the boost circuit 20D connected to the second switching TFT 12D may be called the "second boost circuit", and the boost circuit 20F connected to the third switching TFT 12F may be called the "third boost circuit". Furthermore, the node NA2 boosted by the first boost circuit 20B may be called the "first node", the node NB4 boosted by the second boost circuit 20D may be called the "second node", and the node NC6 boosted by the third boost circuit 20F may be called the "third node".

In FIG. 13A, four equalizer circuits 40A, 40B, 40C, and 40D are illustrated. Hereinafter, the equalizer circuits 40A, 40B, 40C, and 40D are also called the "first equalizer circuit", the "second equalizer circuit", the "third equalizer circuit", and the "fourth equalizer circuit", respectively.

Also, in the present embodiment, two equalizer signal lines EQLA and EQLB are provided.

In the following, the equalizer signal line EQLA is also called the "first equalizer signal line" and the equalizer signal line EQLB is also called the "second equalizer signal line".

The first equalizer circuit 40A and the second equalizer circuit 40B are supplied with an equalizer signal from the first equalizer signal line EQLA. The third equalizer circuit 40C and the fourth equalizer circuit 40D are supplied with an equalizer signal from the second equalizer signal line EQLB.

The first equalizer circuit 40A is connected to the first node NA1 that is connected to the gate electrode of the first switching TFT 12A and to the second node NB3 that is connected to the gate electrode of the second switching TFT 12C of the first unit circuit 11A. The first equalizer circuit 40A can switch between a state in which the first node NA1 and the second node NB3 are electrically connected and a state in which the first node NA1 and the second node NB3 are not electrically connected. By electrically connecting the first node NA1 and the second node NB3, the first equalizer circuit 40A can perform charge sharing between the first node NA1 and the second node NB3.

The second equalizer circuit 40B is connected to the first node NA2 that is connected to the gate electrode of the first switching TFT 12B and to the second node NB4 that is connected to the gate electrode of the second switching TFT 12D of the second unit circuit 11B. The second equalizer circuit 40B can switch between a state in which the first node NA2 and the second node NB4 are electrically connected and a state in which the first node NA2 and the second node NB4 are not electrically connected. By electrically connecting the first node NA2 and the second node NB4, the second equalizer circuit 40B can perform charge sharing between the first node NA2 and the second node NB4.

The third equalizer circuit 40C is connected to the second node NB3 that is connected to the gate electrode of the second switching TFT 12C and to the third node NC5 that is connected to the gate electrode of the third switching TFT 12E of the first unit circuit 11A. The third equalizer circuit 40C can switch between a state in which the second node NB3 and the third node NC5 are electrically connected and a state in which the second node NB3 and the third node NC5 are not electrically connected. By electrically connecting the second node NB3 and the third node NC5, the third equalizer circuit 40C can perform charge sharing between the second node NB3 and the third node NC5.

The fourth equalizer circuit 40D is connected to the second node NB4 that is connected to the gate electrode of the second switching TFT 12D and to the third node NC6 that is connected to the gate electrode of the third switching TFT 12F of the second unit circuit 11B. The fourth equalizer circuit 40D can switch between a state in which the second node NB4 and the third node NC6 are electrically connected and a state in which the second node NB4 and the third node NC6 are not electrically connected. By electrically connecting the second node NB4 and the third node NC6, the fourth equalizer circuit 40D can perform charge sharing between the second node NB4 and the third node NC6.

In the active matrix substrate of the present embodiment, by including the boost circuits 20 in the DEMUX circuit 10D, the driving power can be reduced similarly to the active matrix substrate of Embodiments 1 to 4.

Also, in the active matrix substrate of the present embodiment, the DEMUX circuit 10D includes the equalizer circuits 40 like the ones described above. For this reason, before the second boost circuit 20C (20D) charges the second node NB3 (NB4) (that is, before the pre-charging by the set section 21), the second node NB3 (NB4) and the first node NA1 (NA2) can be electrically connected by the equalizer circuits 40, and charge sharing can be performed between the second node NB3 (NB4) and the first node NA1 (NA2). With this arrangement, the charge of the first node NA1 (NA2) already charged by the first boost circuit 20A (20B) can be used to charge the second node NB3 (NB4). Also, before the third boost circuit 20E (20F) charges the third node NC5 (NC6) (that is, before the pre-charging by the set section 21), the third node NC5 (NC6) and the second node NB3 (NB4) can be electrically connected by the equalizer circuits 40, and charge sharing can be performed between the third node NC5 (NC6) and the second node NB3 (NB4). With this arrangement, the charge of the second node NB3 (NB4) already charged by the second boost circuit 20C (20D) can be used to charge the third node NC5 (NC6).

Through such equalization operation, a node N can be charged using the charge of the other node N before the node N is charged by the boost circuit 20, and therefore the amplitude of the charging by the boost circuit 20 can be decreased. For this reason, because the current for charging (charging current) supplied to each boost circuit 20 can be reduced, a further reduction in the driving power of the DEMUX circuit 10D is possible.

Furthermore, in the present embodiment, because each unit circuit 11 splits the display signal from a single signal output line VL to three source bus lines SL, the number of signal output lines VL can be reduced compared to Embodiments 1 to 4. For this reason, the interconnect region (the region where the signal output lines VL are arranged) can be scaled down and an even thinner bezel can be attained. Also, because the number of amplifiers of the COG-mounted source driver 6 can be reduced, the chip size can be reduced further. For this reason, a greater number of chips can be obtained from a wafer, and the chip cost can be lowered.

Figure 13B:
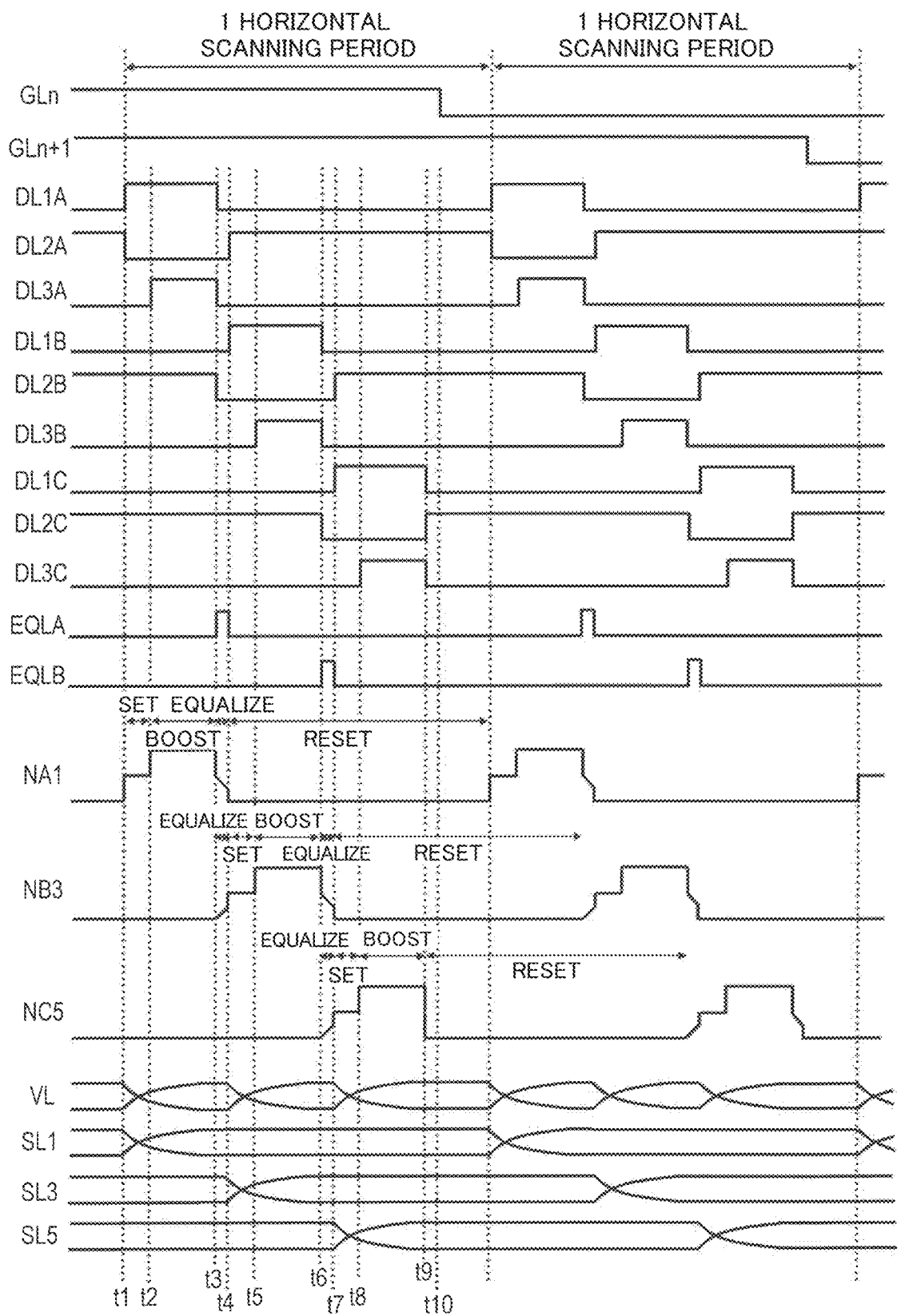
FIG. 13B is a timing chart for explaining operations by the DEMUX circuit 10D.

At this point, operations by the DEMUX circuit 10D will be described further with reference to FIG. 13B. FIG. 13B is a timing chart for explaining operations by the DEMUX circuit 10D. FIG. 13B illustrates the potentials of the first driving signal lines DL1A, DL1B, and DL1C, the second driving signal lines DL2A, DL2B, and DL2C, the third driving signal lines DL3A, DL3B, and DL3C, the first node NA1, the second node NB3, the third node NC5, one of the signal output lines VL, and the source bus lines SL1, SL3, and SL5. Additionally, FIG. 13B also illustrates the potentials of the gate bus lines GLn and GLn+1.

[Time t1]

First switching TFT 12A side: The potential of the first driving signal line DL1A goes to high level while the potential of the second driving signal line DL2A goes to low level, and the first driving signal is input into the set section 21 of the first boost circuit 20A as the set signal. With this arrangement, the first node NA1 connected to the gate electrode of the first switching TFT 12A is pre-charged. Also, the potential of the signal output line VL (that is, the display signal) at this timing changes to a write voltage level, and the charging of the selected source bus line SL1 is started.

Second switching TFT 12C side: The second node NB3 maintains the reset state.

Third switching TFT 12E side: The third node NC5 maintains the reset state.

[Time t2]

First switching TFT 12A side: The potential of the third driving signal line DL3A goes to high level, and the third driving signal is input into the boost section 23 of the first boost circuit 20A as the boost signal. With this arrangement, the potential of the first node NA1 is boosted. By boosting the potential of the first node NA1, the source bus line SL1 is sufficiently charged through the first switching TFT 20A.

Second switching TFT 12C side: The second node NB3 maintains the reset state.

Third switching TFT 12E side: The third node NC5 maintains the reset state.

[Time t3]

First switching TFT 12A side and second switching TFT 12C side: The potential of the first driving signal line DL1A goes to low level, the potential of the third driving signal line DL3A goes to low level, and the potential of the first node NA1 drops to the pre-charge potential. At this time, by causing the potential of the first equalizer signal line EQLA (that is, the equalizer signal) to go to high level, the first node NA1 and the second node NB3 are electrically connected by the first equalizer circuit 40A, and charge sharing is performed. With this arrangement, charge moves from the first node NA1 to the second node NB3, and the potential is equalized between the first node NA1 and the second node NB3.

Third switching TFT 12E side: The third node NC5 maintains the reset state.

[Time t4]

First switching TFT 12A side: The potential of the second driving signal line DL2A goes to high level, and the second driving signal is input into the reset section 22 of the first boost circuit 20A as the reset signal. With this arrangement, the potential of the first node NA1 is reset. At this time, the first switching TFT 20A is switched off, and the potential of the source bus line SL1 is finalized.

Second switching TFT 12C side: The potential of the first driving signal line DL1B goes to high level, and the potential of the second driving signal line DL2B has been at low level since the time t3. Consequently, the first driving signal is input into the set section 21 of the second boost circuit 20C as the set signal. With this arrangement, the second node NB3 connected to the gate electrode of the second switching TFT 12C is pre-charged. Also, the potential of the signal output line VL (that is, the display signal) at this timing changes to a write voltage level, and the charging of the selected source bus line SL3 is started.

Third switching TFT 12E side: The third node NC5 maintains the reset state.

[Time t5]

First switching TFT 12A side: The first node NA1 maintains the reset state.

Second switching TFT 12C side: The potential of the third driving signal line DL3B goes to high level, and the third driving signal is input into the boost section 23 of the second boost circuit 20C as the boost signal. With this arrangement, the potential of the second node NB3 is boosted. By boosting the potential of the second node NB3, the source bus line SL3 is sufficiently charged through the second switching TFT 20C.

Third switching TFT 12E side: The third node NC5 maintains the reset state.

[Time t6]

First switching TFT 12A side: The first node NA1 maintains the reset state.

Second switching TFT 12C side and third switching TFT 12E side: The potential of the first driving signal line DL1B goes to low level, the potential of the third driving signal line DL3B goes to low level, and the potential of the second node NB3 drops to the pre-charge potential. At this time, by causing the potential of the second equalizer signal line EQLB (that is, the equalizer signal) to go to high level, the second node NB3 and the third node NC5 are electrically connected by the third equalizer circuit 40C, and charge sharing is performed. With this arrangement, charge moves from the second node NB3 to the third node NC5, and the potential is equalized between the second node NB3 and the third node NC5.

[Time t7]

First switching TFT 12A side: The first node NA1 maintains the reset state.

Second switching TFT 12C side: The potential of the second driving signal line DL2B goes to high level, and the second driving signal is input into the reset section 22 of the second boost circuit 20C as the reset signal. With this arrangement, the potential of the second node NB3 is reset. At this time, the second switching TFT 12C is switched off, and the potential of the source bus line SL3 is finalized.

Third switching TFT 12E side: The potential of the first driving signal line DL1C goes to high level, and the potential of the second driving signal line DL2C has been at low level since the time t6. Consequently, the first driving signal is input into the set section 21 of the third boost circuit 20E as the set signal. With this arrangement, the third node NC5 connected to the gate electrode of the third switching TFT 12E is pre-charged. Also, the potential of the signal output line VL (that is, the display signal) at this timing changes to a write voltage level, and the charging of the selected source bus line SL5 is started.

[Time t8]

First switching TFT 12A side: The first node NA1 maintains the reset state.

Second switching TFT 12C side: The second node NB3 maintains the reset state.

Third switching TFT 12E side: The potential of the third driving signal line DL3C goes to high level, and the third driving signal is input into the boost section 23 of the third boost circuit 20E as the boost signal. With this arrangement, the potential of the third node NC5 is boosted. By boosting the potential of the third node NC5, the source bus line SL5 is sufficiently charged through the third switching TFT 12E.

[Time t9]

First switching TFT 12A side: The first node NA1 maintains the reset state.

Second switching TFT 12C side: The second node NB3 maintains the reset state.

Third switching TFT 12E side: The potential of the first driving signal line DL1C goes to low level, the potential of the second driving signal line DL2C goes to high level, the potential of the third driving signal line DL3C goes to low level, and the second driving signal is input into the reset section 22 of the third boost circuit 20E as the reset signal. With this arrangement, the potential of the third node NC5 is reset. At this time, the third switching TFT 12E is switched off, and the potential of the source bus line SL5 is finalized.

[Time t10]

When the writing to the source bus lines SL1, SL3, and SL5 is completed (that is, when the potential is finalized), the gate signal supplied from the gate bus line GLn goes to an off level, and the writing of the display voltage to the pixels PIX is completed. Thereafter, writing is performed for all of the gate bus lines GL by repeating the operations described above.

Embodiment 6

Figure 14:
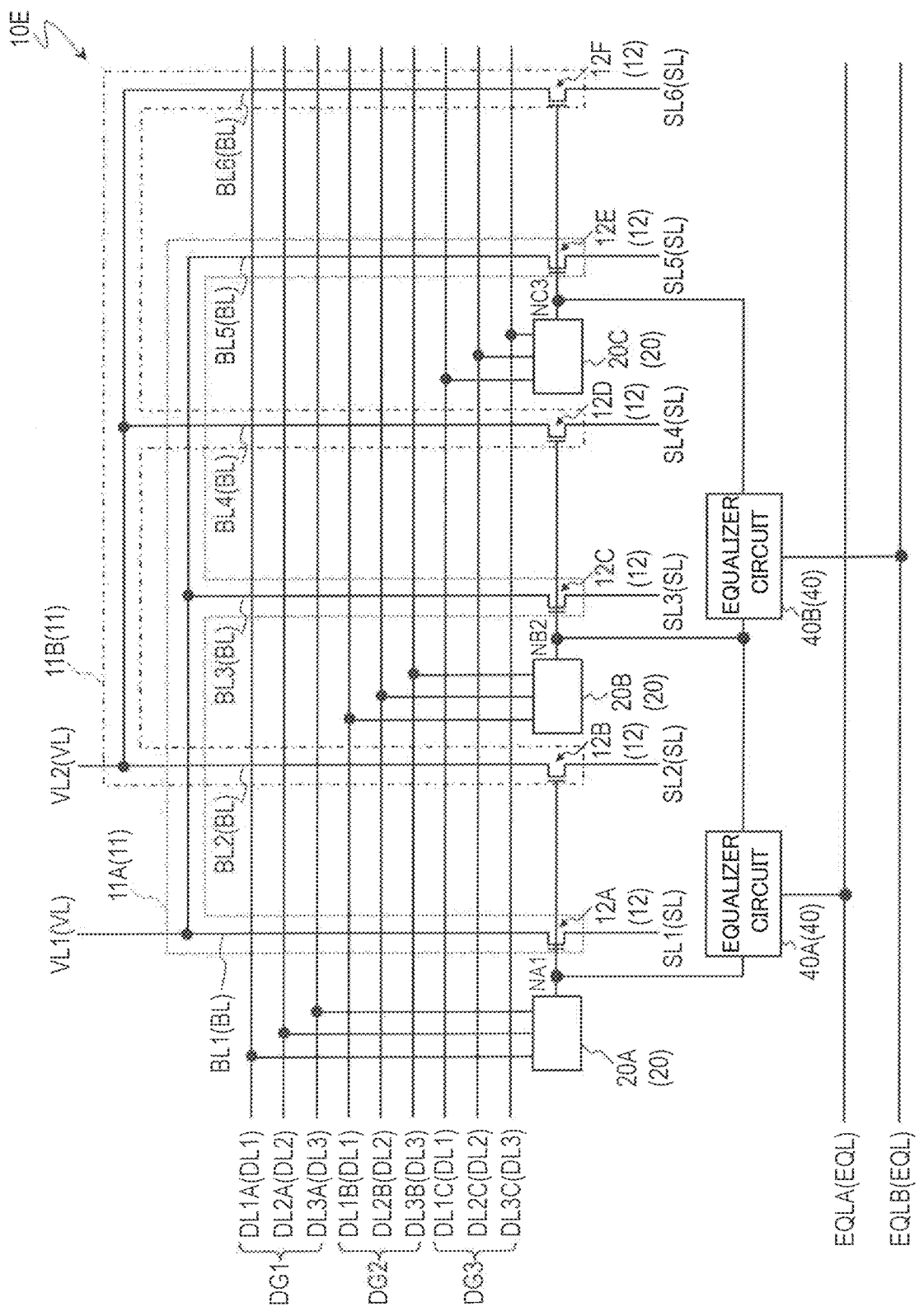
FIG. 14 is a diagram illustrating a configuration of a DEMUX circuit 10E provided in an active matrix substrate according to Embodiment 6.

An active matrix substrate according to the present embodiment will be described with reference to FIG. 14. FIG. 14 is a diagram illustrating a configuration of a DEMUX circuit 10E provided in the active matrix substrate of the present embodiment.

In the DEMUX circuit 10D illustrated in FIG. 13A, one boost circuit 20 is connected to each switching TFT 12. In contrast, in the DEMUX circuit 10E of the present embodiment, as illustrated in FIG. 14, one boost circuit 20 is connected to two switching TFTs 12. Hereinafter, a more specific description will be given.

The three switching TFTs 12 included in the first unit circuit 11A are a first switching TFT 12A, a second switching TFT 12C, and a third switching TFT 12E switched on at mutually different timings inside one horizontal scanning period. Similarly, the three switching TFTs 12 included in the second unit circuit 11B are a first switching TFT 12B, a second switching TFT 12D, and a third switching TFT 12F switched on at mutually different timings inside one horizontal scanning period.

Of the three boost circuits 20A, 20B, and 20C illustrated in FIG. 14, the first boost circuit 20A is connected in common with the first switching TFT 12A of the first unit circuit 11A and the first switching TFT 12B of the second unit circuit 11B. Also, the second boost circuit 20B is connected in common with the second switching TFT 12C of the first unit circuit 11A and the second switching TFT 12D of the second unit circuit 11B. Also, the third boost circuit 20C is connected in common with the third switching TFT 12E of the first unit circuit 11A and the third switching TFT 12F of the second unit circuit 11B.

The gate electrode of the first switching TFT 12A of the first unit circuit 11A and the gate electrode of the first switching TFT 12B of the second unit circuit 11B are connected to a common first node NA1. The gate electrode of the second switching TFT 12C of the first unit circuit 11A and the gate electrode of the second switching TFT 12D of the second unit circuit 11B are connected to a common second node NB2. The gate electrode of the third switching TFT 12E of the first unit circuit 11A and the gate electrode of the third switching TFT 12F of the second unit circuit 11B are connected to a common third node NC3.

Of the two equalizer circuits 40A and 40B illustrated in FIG. 14, the first equalizer circuit 40A is connected to the first node NA1 and the second node NB2, and is supplied with an equalizer signal from a first equalizer signal line EQLA. By electrically connecting the first node NA1 and the second node NB2, the first equalizer circuit 40A can perform charge sharing between the first node NA1 and the second node NB2. Also, the second equalizer circuit 40B is connected to the second node NB2 and the third node NC3, and is supplied with an equalizer signal from a second equalizer signal line EQLB. By electrically connecting the second node NB3 and the third node NC3, the second equalizer circuit 40B can perform charge sharing between the second node NB2 and the third node NC3.

In the present embodiment, by also including the equalizer circuits 40 in the DEMUX circuit 10E, it is possible to reduce the driving power further.

Also, in the present embodiment, one boost circuit 20 is shared between two switching TFTs 12 selected at the same time. For this reason, the number of circuit elements can be decreased. Also, because decreasing the number of circuit elements reduces the load, a further reduction in power consumption can be attained.

Furthermore, because decreasing the number of circuit elements also reduces the circuit area, the layout size can be reduced, and an even thinner bezel can be attained.

Embodiment 7

Figure 15:
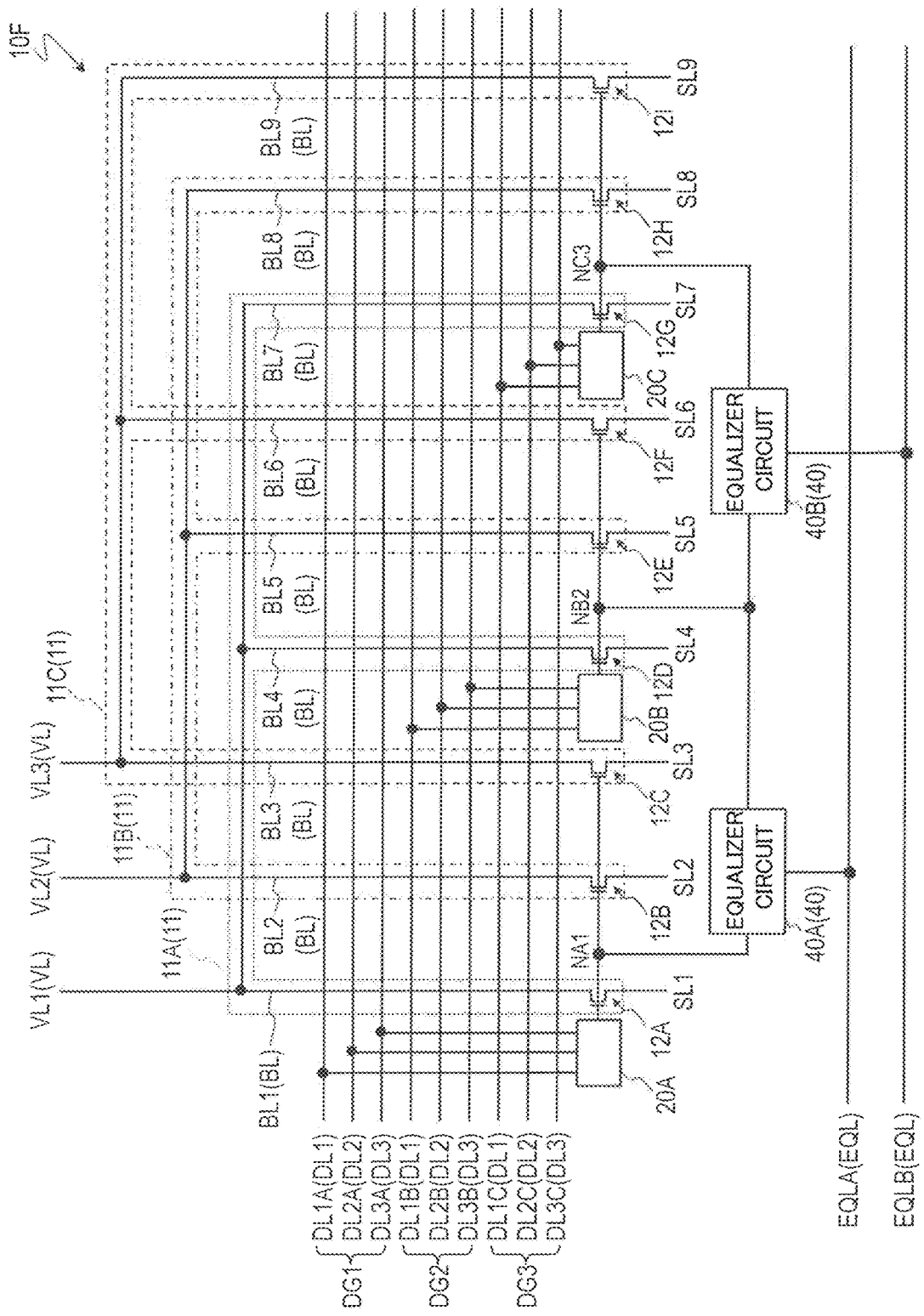
FIG. 15 is a diagram illustrating a configuration of a DEMUX circuit 10F provided in an active matrix substrate according to Embodiment 7.

In the DEMUX circuit 10E in Embodiment 6, one boost circuit 20 is shared between two switching TFTs 12, but one boost circuit 20 may also be shared among three or more switching TFTs 12. Hereinafter, an active matrix substrate according to the present embodiment will be described with reference to FIG. 15. FIG. 15 is a diagram illustrating a configuration of a DEMUX circuit 10F provided in the active matrix substrate of the present embodiment.

In FIG. 15, three unit circuits (hereinafter respectively referred to as the "first unit circuit", the "second unit circuit", and the "third unit circuit") 11A, 11B, and 11C from among the plurality of unit circuits 11 included in the DEMUX circuit 10F are illustrated.

The first unit circuit 11A includes three branch lines BL1, BL4, and BL7 and three switching TFTs 12A, 12D, and 12G, and splits the display signal from the signal output line VL1 to the source bus lines SL1, SL4, and SL7. The three switching TFTs (first switching TFT, second switching TFT, and third switching TFT) 12A, 12D, and 12G of the first unit circuit 11A are switched on at mutually different timings inside one horizontal scanning period.

The second unit circuit 11B includes three branch lines BL2, BL5, and BL8 and three switching TFTs 12B, 12E, and 12H, and splits the display signal from the signal output line VL2 to the source bus lines SL2, SL5, and SL8. The three switching TFTs (first switching TFT, second switching TFT, and third switching TFT) 12B, 12E, and 12H of the second unit circuit 11B are switched on at mutually different timings inside one horizontal scanning period.

The third unit circuit 11C includes three branch lines BL3, BL6, and BL9 and three switching TFTs 12C, 12F, and 12I, and splits the display signal from the signal output line VL3 to the source bus lines SL3, SL6, and SL9. The three switching TFTs (first switching TFT, second switching TFT, and third switching TFT) 12C, 12F, and 12I of the third unit circuit 11C are switched on at mutually different timings inside one horizontal scanning period.

Of the three boost circuits 20A, 20B, and 20C illustrated in FIG. 15, the first boost circuit 20A is connected in common with the first switching TFT 12A of the first unit circuit 11A, the first switching TFT 12B of the second unit circuit 11B, and the first switching TFT 12C of the third unit circuit 11C. Also, the second boost circuit 20B is connected in common with the second switching TFT 12D of the first unit circuit 11A, the second switching TFT 12E of the second unit circuit 11B, and the second switching TFT 12F of the third unit circuit 11C. Also, the third boost circuit 20C is connected in common with the third switching TFT 12G of the first unit circuit 11A, the third switching TFT 12H of the second unit circuit 11B, and the third switching TFT 12I of the third unit circuit 11C.

The gate electrode of the first switching TFT 12A of the first unit circuit 11A, the gate electrode of the first switching TFT 12B of the second unit circuit 11B, and the gate electrode of the first switching TFT 12C of the third unit circuit 11C are connected to a common first node NA1. The gate electrode of the second switching TFT 12D of the first unit circuit 11A, the gate electrode of the second switching TFT 12E of the second unit circuit 11B, and the gate electrode of the second switching TFT 12F of the third unit circuit 11C are connected to a common second node NB2. The gate electrode of the third switching TFT 12G of the first unit circuit 11A, the gate electrode of the third switching TFT 12H of the second unit circuit 11B, and the gate electrode of the third switching TFT 12I of the third unit circuit 11C are connected to a common third node NC3.

Of the two equalizer circuits 40A and 40B illustrated in FIG. 15, the first equalizer circuit 40A is connected to the first node NA1 and the second node NB2, and is supplied with an equalizer signal from a first equalizer signal line EQLA. By electrically connecting the first node NA1 and the second node NB2, the first equalizer circuit 40A can perform charge sharing between the first node NA1 and the second node NB2. Also, the second equalizer circuit 40B is connected to the second node NB2 and the third node NC3, and is supplied with an equalizer signal from a second equalizer signal line EQLB. By electrically connecting the second node NB3 and the third node NC3, the second equalizer circuit 40B can perform charge sharing between the second node NB2 and the third node NC3.

In the present embodiment, by also including the equalizer circuits 40 in the DEMUX circuit 10F, it is possible to reduce the driving power further.

Also, in the present embodiment, one boost circuit 20 is shared between three switching TFTs 12 selected at the same time. For this reason, compared to Embodiment 6 in which one boost circuit 20 is shared between two switching TFTs 12, the number of circuit elements can be decreased further.

Therefore, a further reduction in power consumption and an even thinner bezel can be attained.

Note that although the present embodiment illustrates an example in which one boost circuit 20 is shared among three switching TFTs 12, but one boost circuit 20 may also be shared among four or more switching TFTs 12 selected at the same time.

Embodiment 8

Figure 16:
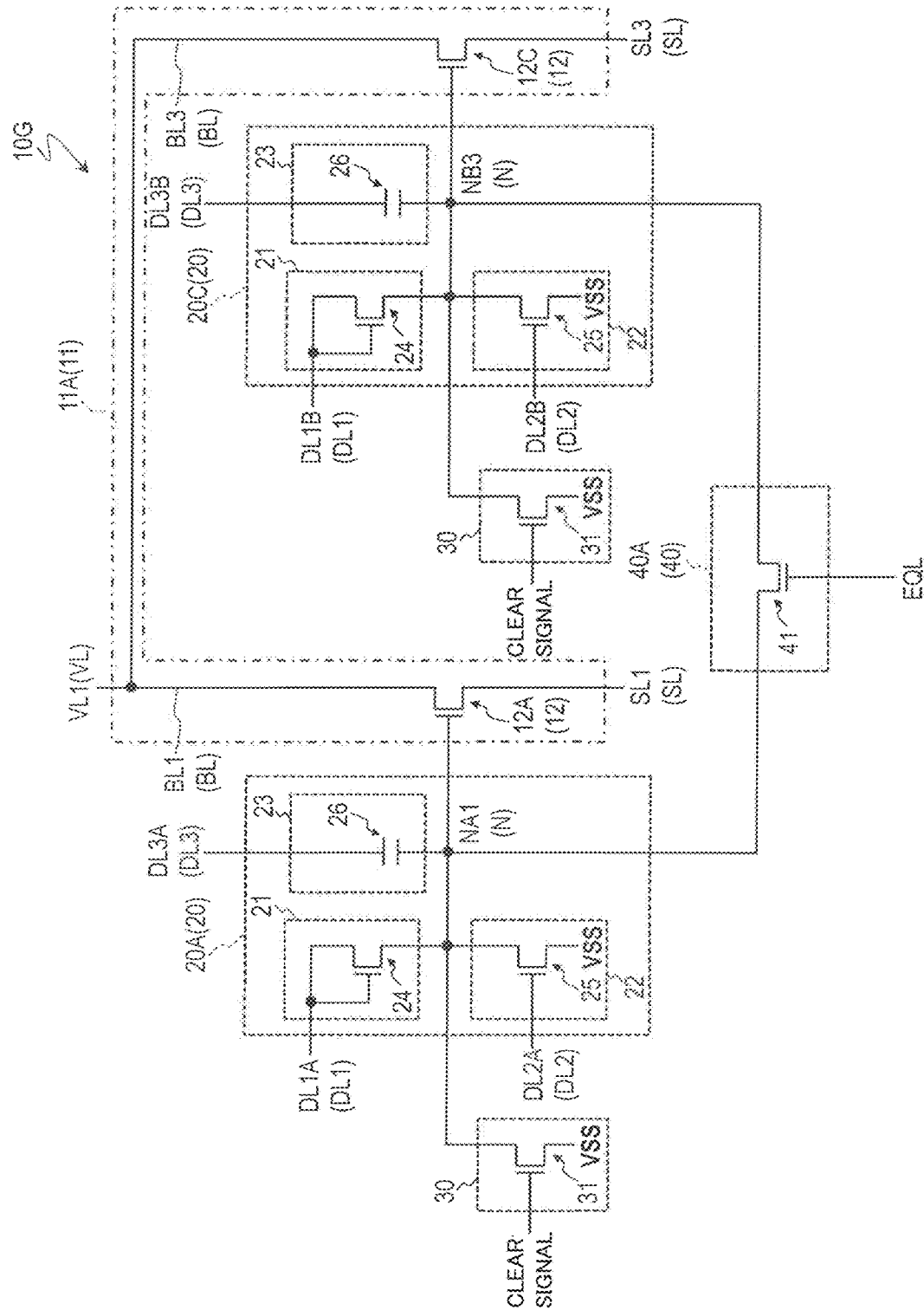
FIG. 16 is a diagram illustrating a configuration of a DEMUX circuit 10G provided in an active matrix substrate according to Embodiment 8.

An active matrix substrate according to the present embodiment will be described with reference to FIG. 16. FIG. 16 is a diagram illustrating a configuration of a DEMUX circuit 10G provided in the active matrix substrate of the present embodiment.

As illustrated in FIG. 16, the DEMUX circuit 10G additionally includes a plurality of clear circuits 30 respectively connected to each boost circuit 20. Each clear circuit 30 is configured to initialize the corresponding boost circuit 20 at a predetermined timing.

In the example illustrated in FIG. 16, each clear circuit 30 includes a TFT (hereinafter referred to as the "clear TFT") 31. A clear signal is supplied to the gate electrode of the clear TFT 31. A constant potential (negative power supply potential VSS) is applied to the source electrode of the clear TFT 31, and the drain electrode of the clear TFT 31 is connected to a node N.

In the DEMUX circuit 10G including the clear circuits 30, when the clear signal supplied to the gate electrode of the clear TFT 31 goes to high level, the boost circuits 20 are initialized. The initialization of the boost circuits 20 by the clear circuits 30 is performed at the beginning or the end of the driving period, for example.

When the initialization of the boost circuits 20 is performed at the beginning of the driving period, the boost circuits 20 operate from an initialized state, and therefore unexpected operations and outputs can be suppressed. Also, when the initialization of the boost circuits 20 is performed at the end of the driving period, the charge (accumulated by driving) of each node can be removed, and therefore TFT degradation caused by residual charge during times of non-activity can be prevented.

Embodiment 9

Figure 17:
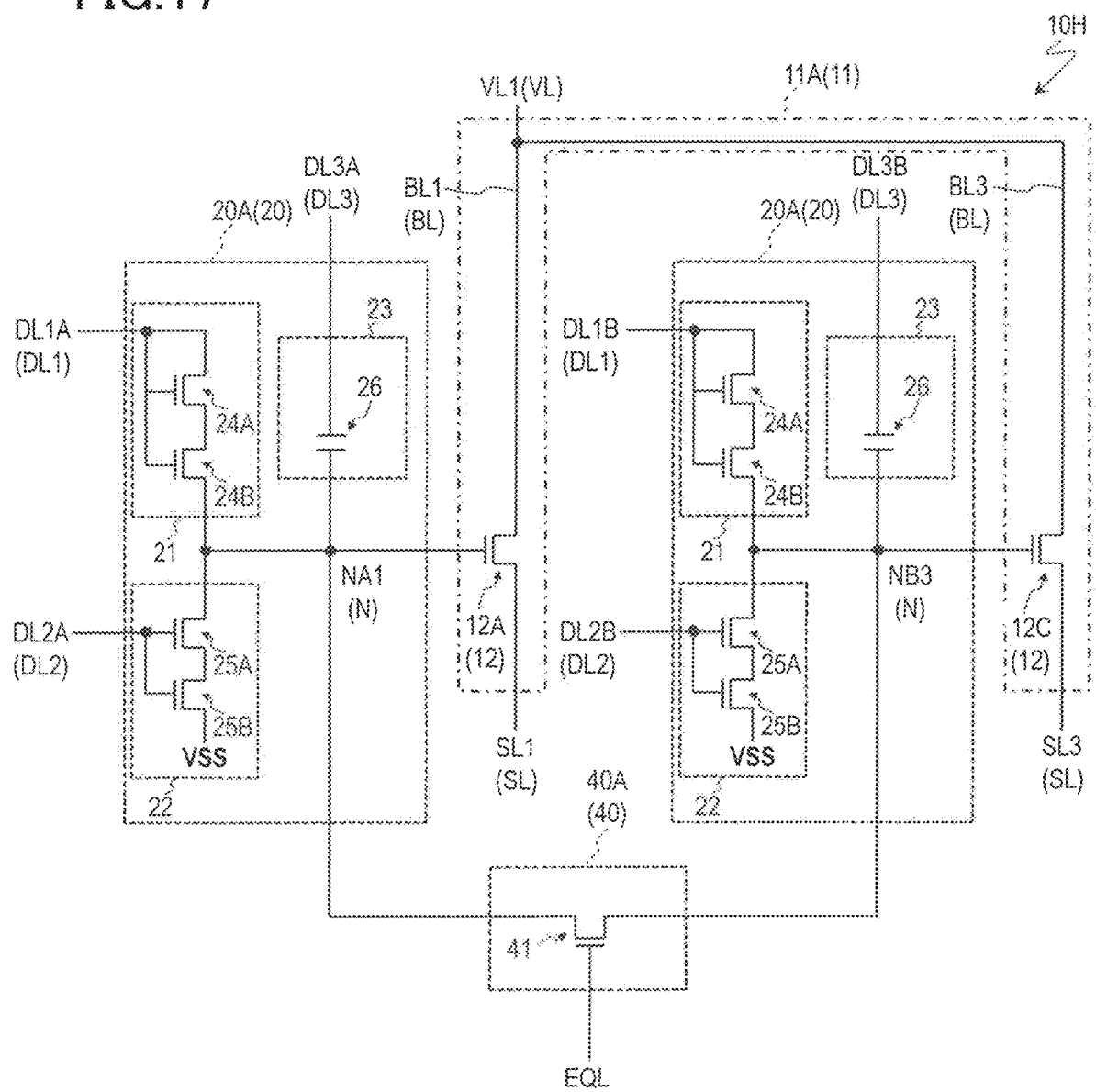
FIG. 17 is a diagram illustrating a configuration of a DEMUX circuit 10H provided in an active matrix substrate according to Embodiment 9.

An active matrix substrate according to the present embodiment will be described with reference to FIG. 17. FIG. 17 is a diagram illustrating a configuration of a DEMUX circuit 10H provided in the active matrix substrate of the present embodiment.

As illustrated in FIG. 17, in the DEMUX circuit 10H, the set section 21 of each boost circuit 20 includes a plurality of set TFTs 24A and 24B connected in series to each other. Additionally, the reset section 22 of each boost circuit 20 includes a plurality of reset TFTs 25A and 25B connected in series to each other.

In the example illustrated in FIG. 17, the set section 21 includes two set TFTs 24A and 24B (hereinafter respectively referred to as the "first set TFT" and the "second set TFT").

The gate electrode and the drain electrode of the first set TFT 24A is connected to the first driving signal line DL1. In other words, the first set TFT 24A is diode-connected. The source electrode of the first set TFT 24A is connected to the drain electrode of the second set TFT 24B. The gate electrode of the second set TFT 24B is connected to the first driving signal line DL1, and the source electrode of the second set TFT 24B is connected to the node N.

Also, in the example illustrated in FIG. 17, the reset section 22 includes two reset TFTs 25A and 25B (hereinafter respectively referred to as the "first reset TFT" and the "second reset TFT"). The gate electrode of the first reset TFT 25A is connected to the second driving signal line DL2. The drain electrode of the first reset TFT 25A is connected to the node N, and the source electrode of the first reset TFT 25A is connected to the drain electrode of the second reset TFT 25B. The gate electrode of the second reset TFT 25B is connected to the second driving signal line DL2. A constant potential (negative power supply potential VSS) is applied to the source electrode of the second reset TFT 25B.

As described above, by having the set section 21 of each boost circuit 20 include the plurality of set TFTs 24A and 24B connected in series to each other and additionally include the plurality of reset TFTs 25A and 25B connected in series to each other, when the node N is boosted by the operation of the boost circuit 20, the potential difference applied between the source and the drain of the individual TFTs can be decreased (approximately halved with the configuration illustrated as an example).

In other words, an improvement in the breakdown voltage can be attained.

Embodiment 10

Figure 18:
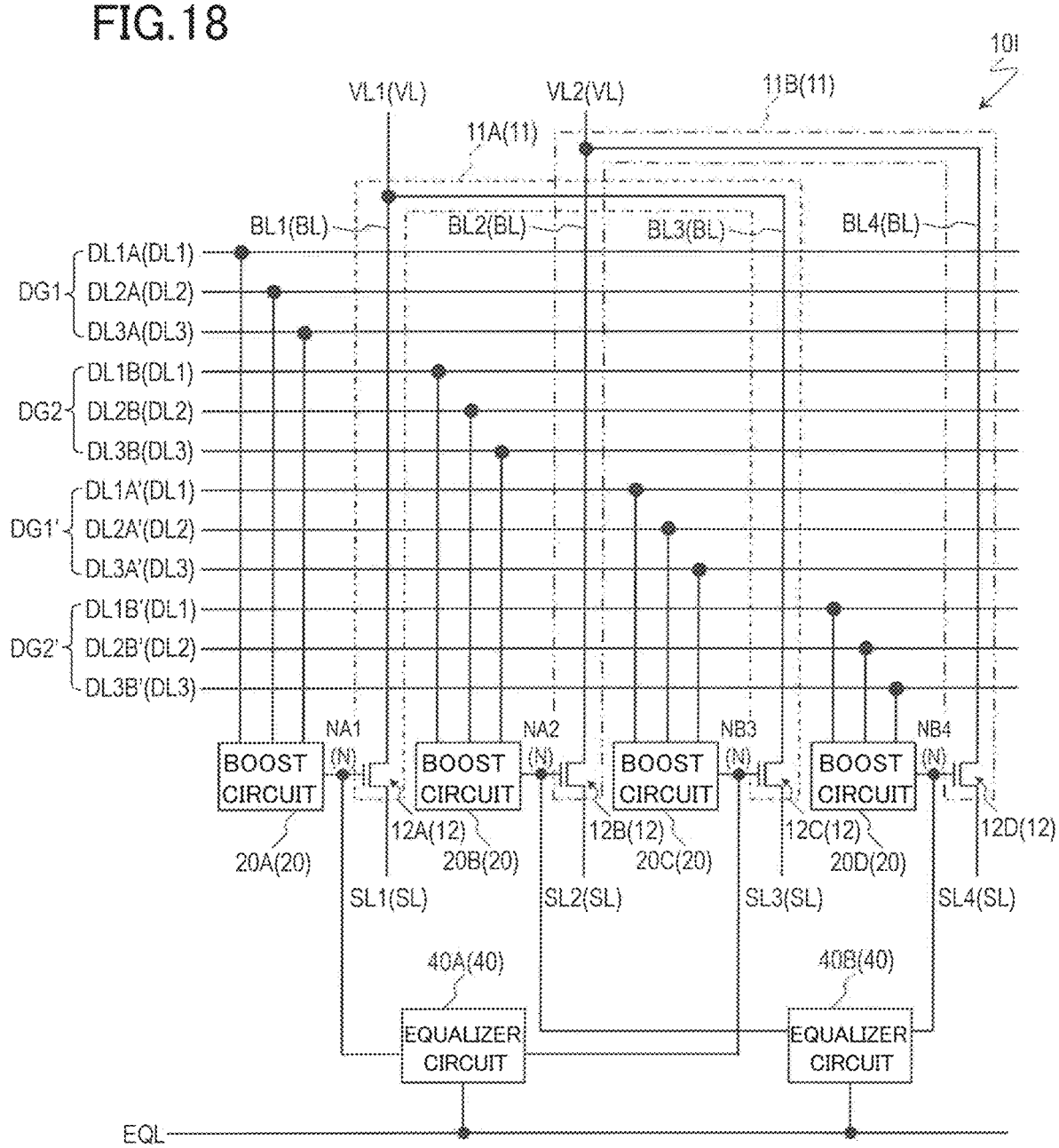
FIG. 18 is a diagram illustrating a configuration of a DEMUX circuit 10I provided in an active matrix substrate according to Embodiment 10.

An active matrix substrate according to the present embodiment will be described with reference to FIG. 18. FIG. 18 is a diagram illustrating a configuration of a DEMUX circuit 10I provided in the active matrix substrate of the present embodiment.

The DEMUX circuit 10I illustrated in FIG. 18 is different from the DEMUX circuit 10 illustrated in FIG. 2 by being provided with additional driving signal line groups DG1' and DG2' in addition to the driving signal line groups DG1 and DG2.

Of the four boost circuits 20 illustrated in FIG. 18, the boost circuit 20A is driven by the driving signal line group DG1, and the boost circuit 20B is driven by the driving signal line group DG2. Also, the boost circuit 20C is driven by the driving signal line group DG1', and the boost circuit 20D is driven by the driving signal line group DG2'.

In the DEMUX circuit 10 illustrated in FIG. 2, the boost circuit 20A and the boost circuit 20B driven at the same timing are driven by the same driving signal line group DG1. Also, the boost circuit 20C and the boost circuit 20D driven at the same timing are driven by the same driving signal line group DG2.

In contrast, in the DEMUX circuit 10I illustrated in FIG. 18, the boost circuit 20A and the boost circuit 20B driven at the same timing are respectively driven by the different driving signal line groups DG1 and DG1'. Also, the boost circuit 20C and the boost circuit 20D driven at the same timing are respectively driven by the different driving signal line groups DG2 and DG2'.

A driving signal for driving the boost circuits 20 at a certain timing is phase-developed and supplied to the driving signal line groups DG1 and DG1'. In other words, the driving signal line groups DG1 and DG1' are separate line groups that supply substantially the same signal.

A driving signal for driving the boost circuits 20 at another certain timing is phase-developed and supplied to the driving signal line groups DG2 and DG2'. In other words, the driving signal line groups DG2 and DG2' are separate line groups that supply substantially the same signal.

As described above, in the present embodiment, a line group that supplies a driving signal group for driving a subset of two or more boost circuits 20 driven at the same timing and a different line group that supplies a driving signal group for driving another subset of the boost circuits 20 are provided. For this reason, the number of circuits connected to a single driving signal line can be decreased, and therefore the load on the individual driving signal lines can be reduced, and the transition times (the rising time and the falling time) of the driving signals can be shortened. Consequently, faster operation is possible.

[Oxide Semiconductor]

The oxide semiconductor included in the oxide semiconductor layer of the switching TFTs 12 may be an amorphous oxide semiconductor or a crystalline oxide semiconductor containing a crystalline portion.

Examples of crystalline oxide semiconductors include a polycrystalline oxide semiconductor, a microcrystalline oxide semiconductor, and an crystalline oxide semiconductor whose c-axis is oriented mostly perpendicular to the layer plane.

The oxide semiconductor layer may also have a layered structure with two or more layers. In the case where the oxide semiconductor layer has a layered structure, the oxide semiconductor layer may also include an amorphous oxide semiconductor layer and a crystalline oxide semiconductor layer. Alternatively, the oxide semiconductor layer may contain a plurality of crystalline oxide semiconductor layers with different crystal structures. The oxide semiconductor layer may also include a plurality of amorphous oxide semiconductor layers. In the case where the oxide semiconductor layer has a bilayer structure including an upper layer and a lower layer, the energy gap of the oxide semiconductor included in the layer positioned on the gate electrode side of the two layers (the lower layer in the case of a bottom-gate structure, or the upper layer in the case of a top-gate structure) may be smaller than the energy gap of the oxide semiconductor included in the layer positioned on the opposite side from the gate electrode (the upper layer in the case of a bottom-gate structure, or the lower layer in the case of a top-gate structure). However, in the case where the difference in the energy gap between these layers is relatively small, the energy gap of the oxide semiconductor in the layer positioned on the gate electrode side may also be larger than the energy gap of the oxide semiconductor in the layer positioned on the opposite side from the gate electrode.

Properties such as the material, structure, deposition method, and configuration of the oxide semiconductor layers having a layered structure in the amorphous oxide semiconductor and each of the above crystalline oxide semiconductors are described in Japanese Unexamined Patent Application Publication No. 2014-007399, for example. The entirety of the content disclosed in Japanese Unexamined Patent Application Publication No. 2014-007399 is hereby incorporated by reference.

The oxide semiconductor layer may contain at least one metallic element from among In, Ga, and Zn, for example. In the embodiments of the present invention, the oxide semiconductor layer contains an In—Ga—Zn—O semiconductor (such as indium gallium zinc oxide), for example. Here, an In—Ga—Zn—O semiconductor is a ternary oxide of indium (In), gallium (Ga), and zinc (Zn). The proportions (composition ratio) of In, Ga, and Zn are not particularly limited, and include ratios such as In:Ga:Zn=2:2:1, In:Ga:Zn=1:1:1, and In:Ga:Zn=1:1:2 for example. Such an oxide semiconductor layer may be formed from an oxide semiconductor film containing an In—Ga—Zn—O semiconductor.

The In—Ga—Zn—O semiconductor may be amorphous or crystalline. In the case of a crystalline In—Ga—Zn—O semiconductor, a crystalline In—Ga—Zn—O semiconductor whose c-axis is oriented mostly perpendicular to the layer plane is preferable.

Note that crystal structures of a crystalline In—Ga—Zn—O semiconductor are disclosed in literature such as Japanese Unexamined Patent Application Publication No. 2014-007399 described above, Japanese Unexamined Patent Application Publication No. 2012-134475, and Japanese Unexamined Patent Application Publication No. 2014-209727, for example. The entirety of the content disclosed in Japanese Unexamined Patent Application Publication No. 2012-134475 and Japanese Unexamined Patent Application Publication No. 2014-209727 is hereby incorporated by reference. A TFT having an In—Ga—Zn—O semiconductor layer has high mobility (over 20 times higher compared to a-SiTFT) and low leak current (less than 1/100th of a-SiTFT) and therefore may be used favorably as the switching TFTs 12, and furthermore may also be used favorably as driving TFTs (for example, TFTs included in the driving circuit provided on the same substrate as the display region in the periphery of the display region containing a plurality of pixels) and pixel TFTs (TFTs provided in the pixels).

The oxide semiconductor layer may also include another oxide semiconductor instead of an In—Ga—Zn—O semiconductor. For example, the oxide semiconductor layer may also include an In—Sn—Zn—O semiconductor (for example, In2O3-SnO2-ZnO; InSnZnO). An In—Sn—Zn—O semiconductor is a ternary oxide of indium (In), tin (Sn), and zinc (Zn). Alternatively, the oxide semiconductor layer may contain a semiconductor such as an In—Al—Zn—O semiconductor, an In—Al—Sn—Zn—O semiconductor, a Zn—O semiconductor, an In—Zn—O semiconductor, a Zn—Ti—O semiconductor, a Cd—Ge—O semiconductor, a Cd—Pb—O semiconductor, CdO (cadmium oxide), a Mg—Zn—O semiconductor, an In—Ga—Sn—O semiconductor, an In—Ga—O semiconductor, a Zr—In—Zn—O semiconductor, or a Hf—In—Zn—O semiconductor.

Embodiment 11

Figure 19:
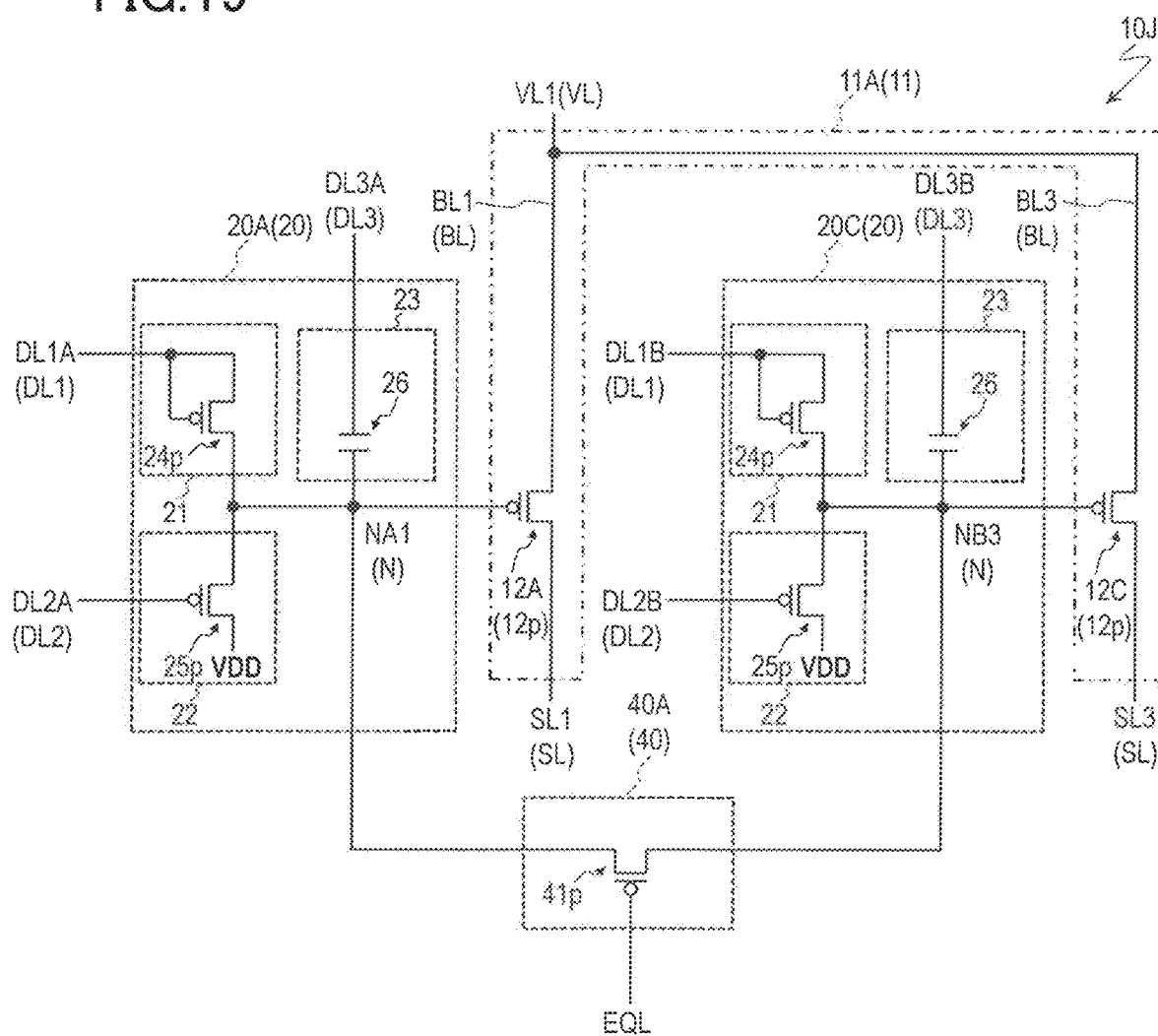
FIG. 19 is a diagram illustrating a configuration of a DEMUX circuit 10J provided in an active matrix substrate according to Embodiment 11.

An active matrix substrate according to the present embodiment will be described with reference to FIG. 19. FIG. 19 is a diagram illustrating a configuration of a DEMUX circuit 10J provided in the active matrix substrate of the present embodiment.

The DEMUX circuit 10J illustrated in FIG. 19 is different from the DEMUX circuit 10 illustrated in FIG. 6 in that a switching TFT 12p of each unit circuit 11 is a PMOS transistor containing a polycrystalline silicon semiconductor layer (for example, a low-temperature polysilicon (LTPS) layer) as an active layer. Also, in the DEMUX circuit 10J, the other TFTs forming the circuit are PMOS transistors containing a polycrystalline silicon semiconductor layer. Consequently, a set TFT 24p of the set section 21 and a reset TFT 25p of the reset section 22 are PMOS transistors containing a polycrystalline silicon semiconductor layer. In addition, an equalizer TFT 41*p* of the equalizer circuit 40 is also a PMOS transistor containing a polycrystalline silicon semiconductor layer.

Even in the case where the DEMUX circuit is configured using PMOS transistors like the DEMUX circuit 10J illustrated in FIG. 19, the DEMUX circuit can be driven with the same timings and the like as the DEMUX circuit 10 illustrated in FIG. 2, except that the polarity of the signals and the like is inverted (a positive power supply potential VDD is applied to the source electrode of the reset TFT 25*p*).

As already described, polycrystalline silicon has a higher mobility than an oxide semiconductor, but PMOS has low mobility compared to NMOS. For this reason, in the case where only PMOS transistors containing a polycrystalline silicon semiconductor layer as an active layer are used as the TFTs for the DEMUX circuit, a problem similar to the case of using oxide semiconductor TFTs occurs.

By having the DEMUX circuit 10J include the boost circuits 20 like the present embodiment, a reduction in driving power and a thinner bezel can be achieved.

(Display Device)

An active matrix substrate (semiconductor device) according to an embodiment of the present invention may be used favorably in a display device. Note that the although the foregoing describes an example of an active matrix substrate of a liquid crystal display device that presents a display with a lateral electric field mode such as FFS mode, the present technology may also be applied to an active matrix substrate of a liquid crystal display that presents a display with a vertical electric field mode that applies a voltage in the thickness direction of the liquid crystal layer (for example, TN mode or vertical alignment mode). Furthermore, the active matrix substrate according to an embodiment of the present invention may also be used favorably in a display device other than a liquid crystal display device (a display device provided with a display medium layer other than a liquid crystal layer). For example, the active matrix substrate according to an embodiment of the present invention may also be used in a device such as an electrophoretic display device or an organic electroluminescence (EL) display device.

A liquid crystal display device may be provided with an active matrix substrate, an opposing substrate disposed opposite the active matrix substrate, and a liquid crystal layer provided between the active matrix substrate and the opposing substrate. An organic EL display device may be provided with an active matrix substrate and an organic EL layer provided on the active matrix substrate.

According to an embodiment of the present invention, the driving power of an active matrix substrate provided with a demultiplexer circuit can be reduced. An active matrix substrate according to an embodiment of the present invention may be used favorably in various types of display devices.

What is claimed is:

1. An active matrix substrate having a display region that includes a plurality of pixel regions and a peripheral region positioned at a periphery of the display region, the active matrix substrate comprising:
   a substrate;
   a source driver that includes a plurality of gate bus lines and a plurality of source bus lines provided on the substrate, and a source driver that is disposed in the peripheral region and includes a plurality of output terminals;
   a plurality of signal output lines respectively connected to each of the plurality of output terminals of the source driver; and
   a demultiplexer circuit that includes a plurality of unit circuits supported by the substrate and is disposed in the peripheral region, wherein
   each of the plurality of unit circuits of the demultiplexer circuit splits a display signal from one signal output line among the plurality of signal output lines to n (where n is an integer equal to or greater than 2) source bus lines among the plurality of source bus lines,
   each of the plurality of unit circuits includes
      n branch lines connected to the one signal output line and
      n switching TFTs respectively to each of the n branch lines, being n switching TFTs that individually control a switching on/off of an electrical connection between the n branch lines and the n source bus lines,
   the demultiplexer circuit additionally includes a plurality of boost circuits configured to boost a voltage applied to a gate electrode of the n switching TFTs,
   each of the plurality of boost circuits includes
      a set section that pre-charges a node connected to the gate electrode,
      a boost section that boosts a potential of the node pre-charged by the set section, and
      a reset section that resets the potential of the node, and
   provided that the node boosted by the boost section of a first boost circuit among the plurality of boost circuits is called a first node and the node boosted by the boost section of a second boost circuit different from the first boost circuit is called a second node,
   the demultiplexer circuit additionally includes an equalizer circuit configured to perform charge-sharing such that a charge moves from the first node to the second node and that the first node and the second node have an identical potential, by electrically connecting the first node and the second node.

2. The active matrix substrate according to claim 1, wherein
   the demultiplexer circuit additionally includes an equalizer signal line that supplies an equalizer signal to the equalizer circuit, and
   the equalizer circuit includes an equalizer TFT that includes a gate electrode connected to the equalizer signal line, and a source electrode and a drain electrode of which one is connected to the first node and the other is connected to the second node.

3. The active matrix substrate according to claim 1, wherein
   the n switching TFTs included in each of the plurality of unit circuits include two switching TFTs that are switched on at mutually different timings inside one horizontal scanning period,
   the first boost circuit is connected to one of the two switching TFTs, and
   the second boost circuit is connected to the other of the two switching TFTs.

4. The active matrix substrate according to claim 3, wherein
   the demultiplexer circuit includes
      a first driving signal line that supplies a first driving signal to the set section,
      a second driving signal line that supplies a second driving signal to the reset section, and
      a third driving signal line that supplies a third driving signal to the boost section, and the first driving signal line for the first boost circuit doubles as the second driving signal line for the second boost circuit, and the first driving signal line for the second boost circuit doubles as the second driving signal line for the first boost circuit.

5. The active matrix substrate according to claim 1, wherein
the n switching TFTs included in each of the plurality of unit circuits are two switching TFTs, and
the plurality of boost circuits include two boost circuits respectively connected to the two switching TFTs.

6. The active matrix substrate according to claim 1, wherein
the n switching TFTs included in each of the plurality of unit circuits are two switching TFTs, and
the two switching TFTs are a first switching TFT and a second switching TFT that are switched on at mutually different timings inside one horizontal scanning period, and
the plurality of boost circuits include a boost circuit connected in common to the first switching TFT of two unit circuits among the plurality of unit circuits and a boost circuit connected in common to the second switching TFT of the two unit circuits.

7. The active matrix substrate according to claim 1, wherein
the n switching TFTs included in each of the plurality of unit circuits are two switching TFTs, and
the two switching TFTs are a first switching TFT and a second switching TFT that are switched on at mutually different timings inside one horizontal scanning period, and
the plurality of boost circuits include a boost circuit connected in common to the first switching TFT of three or more unit circuits among the plurality of unit circuits and a boost circuit connected in common to the second switching TFT of the three or more unit circuits.

8. The active matrix substrate according to claim 1, wherein
the n switching TFTs included in each of the plurality of unit circuits are three switching TFTs,
the three switching TFTs are a first switching TFT, a second switching TFT, and a third switching TFT that are switched on at mutually different timings inside one horizontal scanning period, and
the plurality of boost circuits include a boost circuit connected in common to the first switching TFT of three or more unit circuits among the plurality of unit circuits, a boost circuit connected in common to the second switching TFT of the three or more unit circuits, and a boost circuit connected in common to the third switching TFT of the three or more unit circuits.

9. The active matrix substrate according to claim 1, wherein
the demultiplexer circuit additionally includes a plurality of clear circuits that are respectively connected to the plurality of boost circuits and that initialize a corresponding boost circuit at a predetermined timing.

10. The active matrix substrate according to claim 1, wherein
each of the set section and the reset section includes a plurality of TFTs connected in series to each other.

11. The active matrix substrate according to claim 1, wherein
the plurality of boost circuits include two or more boost circuits driven at the same timing, and the demultiplexer circuit includes a first driving signal line group that supplies a driving signal group for driving a subset of boost circuits among the two or more boost circuits and a second driving signal line group that supplies a driving signal group for driving another subset of boost circuits among the two or more boost circuits, the second driving signal line group being different from the first driving signal line group.

12. The active matrix substrate according to claim 1, wherein
each of the n switching TFTs includes an oxide semiconductor layer as an active layer.

13. The active matrix substrate according to claim 12, wherein
the oxide semiconductor layer contains an In—Ga—Zn—O semiconductor.

14. The active matrix substrate according to claim 13, wherein
the In—Ga—Zn—O semiconductor includes a crystalline portion.

15. The active matrix substrate according to claim 1, wherein
each of the n switching TFTs is a PMOS transistor that includes a polycrystalline silicon semiconductor layer as an active layer.

16. A display device comprising the active matrix substrate according to claim 1.

17. An active matrix substrate having a display region that includes a plurality of pixel regions and a peripheral region positioned at a periphery of the display region, the active matrix substrate comprising:
a substrate;
a source driver that includes a plurality of gate bus lines and a plurality of source bus lines provided on the substrate, and a source driver that is disposed in the peripheral region and includes a plurality of output terminals;
a plurality of signal output lines respectively connected to each of the plurality of output terminals of the source driver; and
a demultiplexer circuit that includes a plurality of unit circuits supported by the substrate and is disposed in the peripheral region, wherein
each of the plurality of unit circuits of the demultiplexer circuit splits a display signal from one signal output line among the plurality of signal output lines to n (where n is an integer equal to or greater than 2) source bus lines among the plurality of source bus lines,
each of the plurality of unit circuits includes
n branch lines connected to the one signal output line and
n switching TFTs respectively to each of the n branch lines, being n switching TFTs that individually control a switching on/off of an electrical connection between the n branch lines and the n source bus lines,
the demultiplexer circuit additionally includes a plurality of boost circuits configured to boost a voltage applied to a gate electrode of the n switching TFTs,
each of the plurality of boost circuits includes
a set section that pre-charges a node connected to the gate electrode,
a boost section that boosts a potential of the node pre-charged by the set section, and
a reset section that resets the potential of the node, and
provided that the node boosted by the boost section of a first boost circuit among the plurality of boost circuits is called a first node and the node boosted by the boost section of a second boost circuit different from the first boost circuit is called a second node, the demultiplexer circuit additionally includes an equalizer circuit configured to perform charge-sharing between the first node and the second node by electrically connecting the first node and the second node, the n switching TFTs included in each of the plurality of unit circuits are three switching TFTs, each of the plurality of unit circuits includes three boost circuits among the plurality of boost circuits, and each of the three boost circuits is connected to each of the three switching TFTs.

18. An active matrix substrate having a display region that includes a plurality of pixel regions and a peripheral region positioned at a periphery of the display region, the active matrix substrate comprising:

a substrate;

a source driver that includes a plurality of gate bus lines and a plurality of source bus lines provided on the substrate, and a source driver that is disposed in the peripheral region and includes a plurality of output terminals;

a plurality of signal output lines respectively connected to each of the plurality of output terminals of the source driver; and a demultiplexer circuit that includes a plurality of unit circuits supported by the substrate and is disposed in the peripheral region, wherein each of the plurality of unit circuits of the demultiplexer circuit splits a display signal from one signal output line among the plurality of signal output lines to n (where n is an integer equal to or greater than 2) source bus lines among the plurality of source bus lines, each of the plurality of unit circuits includes n branch lines connected to the one signal output line and n switching TFTs respectively to each of the n branch lines, being n switching TFTs that individually control a switching on/off of an electrical connection between the n branch lines and the n source bus lines, the demultiplexer circuit additionally includes a plurality of boost circuits configured to boost a voltage applied to a gate electrode of the n switching TFTs, each of the plurality of boost circuits includes a set section that pre-charges a node connected to the gate electrode, a boost section that boosts a potential of the node pre-charged by the set section, and a reset section that resets the potential of the node, and provided that the node boosted by the boost section of a first boost circuit among the plurality of boost circuits is called a first node and the node boosted by the boost section of a second boost circuit different from the first boost circuit is called a second node, the demultiplexer circuit additionally includes an equalizer circuit configured to perform charge-sharing between the first node and the second node by electrically connecting the first node and the second node, the n switching TFTs included in each of the plurality of unit circuits are three switching TFTs, the three switching TFTs are a first switching TFT, a second switching TFT, and a third switching TFT that are switched on at mutually different timings inside one horizontal scanning period, and the plurality of boost circuits include a boost circuit connected in common to the first switching TFT of two unit circuits among the plurality of unit circuits, a boost circuit connected in common to the second switching TFT of the two unit circuits, and a boost circuit connected in common to the third switching TFT of the two unit circuits.

* * * * *